US 6,661,859 B1

(12) United States Patent
Wu

(10) Patent No.: US 6,661,859 B1
(45) Date of Patent: Dec. 9, 2003

(54) SYNCHRONIZER FOR A SOURCE SYNCHRONIZED CLOCK BUS WITH MULTIPLE AGENTS

(75) Inventor: Leon Li-Heng Wu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/451,197

(22) Filed: Nov. 29, 1999

(51) Int. Cl.$^7$ .................................................. H04L 7/00
(52) U.S. Cl. .................. 375/354; 375/356; 375/371; 375/118; 375/119; 375/117; 375/106; 370/103
(58) Field of Search ................................ 375/356, 354, 375/371, 118, 119, 107, 106; 370/103

(56) References Cited

U.S. PATENT DOCUMENTS 5,432,823 A * 7/1995 Gasbarro et al. ............. 375/356

* cited by examiner

Primary Examiner—Stephen Chin
Assistant Examiner—Guillermo Munóz
(74) Attorney, Agent, or Firm—Bracewell & Patterson LLP

(57) ABSTRACT

A synchronizer for providing a source-synchronized clock bus reduces the effect of clock skew during the signal capturing process. The synchronizer includes at least one capture latch in the capture clock domain for capturing the signal, at least one storage latch for storing the signal coupled to the at least one capture latch, and a multiplexer coupled to the at least one storage latch. The multiplexer synchronizes data transfer of the at least one storage latch and the at least one capture latch, and an internal latch in the internal clock domain. The signal is controlled and processed by strobe signals and clock signals from the sending chip.

10 Claims, 19 Drawing Sheets

Long Path $\zeta^{76}$
| Time ↓ | Capture Latch $\zeta_{12}$ | Storage Latch $\zeta_{14}$ | Internal Latch $\zeta_{22}$ |
E1
B1
L1 → 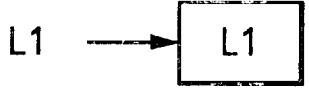 
E2
Transfer 1 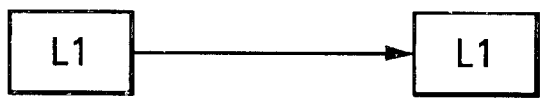
B2
L2 → 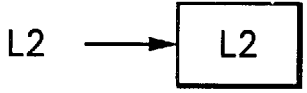 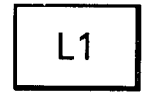
E3
Transfer 2 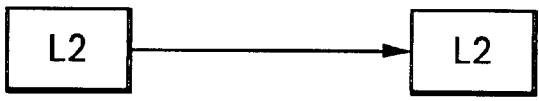
*Fig. 6b*

SYNCHRONIZER FOR A SOURCE SYNCHRONIZED CLOCK BUS WITH MULTIPLE AGENTS

BACKGROUND OF THE INVENTION

1. Technical Field

The present invention relates in general to a synchronizer used for providing a source synchronized bus and in particular to a synchronizer used for providing a source synchronized clock bus with multiple agents wherein the synchronized bus reduces the effect of clock skew during the signal capturing process.

2. Description of the Related Art

It is well known that providing a source synchronized bus reduces the effect of clock skew on the signal capturing process. After a signal is captured, the signal has to be transferred from the capture clock domain to an internal clock domain. A synchronizer is a circuit that accomplishes such a signal transfer from the capture clock domain to the internal clock domain.

However, a high performance source synchronized bus with multiple agents comprises a number of challenges and problems. For example, a first problem involves the timing of the capture and transfer signals. A long path (i.e. slow path delay) associated with a first cycle may lag behind a short path (i.e. fast path delay) of a second cycle. This first abnormality may result in erroneous signal capturing. Furthermore, a second problem is a situation that results from the separation of two signals of two different cycles for two different agents. The separation is reduced by many factors such as noise of reference voltage, time compression effect of space time relativity, and delay element variation. This second problem poses significant design challenges both in terms of control signal generation and noise margin of the synchronous latch.

It is therefore advantageous and desirable to provide a synchronizer used for providing a source synchronized clock bus with multiple agents wherein the synchronized bus reduces the effect of clock skew during the signal capturing process. It is also advantageous and desirable to provide a synchronizer that overcomes or resolves the problem involving the timing of the capture and transfer signals wherein a long path (i.e. slow path delay) associated with a first cycle may lag behind a short path (i.e. fast path delay) of a second cycle. It is further advantageous and desirable to provide a synchronizer that eliminates or minimizes erroneous signal capturing that results from the signal capture and transfer timing problem. It is still also advantageous and desirable to provide a synchronizer that overcomes or helps resolve the problem of the reduction of separation of two signals of two different cycles for two different agents wherein the reduction is a result of many factors such as noise of reference voltage, time compression effect of space time relativity, and delay element variation. It is still further advantageous and desirable to provide a synchronizer that has a design with control signal generation and noise margin of the synchronous latch that overcomes the reduction problem of the separation of the two signals.

SUMMARY OF THE INVENTION

It is therefore one object of the present invention to provide a synchronizer used for providing a source synchronized clock bus with multiple agents wherein the synchronized bus reduces the effect of clock skew during the signal capturing process.

It is another object of the present invention to provide a synchronizer that overcomes or resolves the problem involving the timing of the capture and transfer signals wherein a long path (i.e. slow path delay) associated with a first cycle may lag behind a short path (i.e. fast path delay) of a second cycle.

It is a further object of the present invention to provide a synchronizer that eliminates or minimizes erroneous signal capturing that results from the signal capture and transfer timing problem.

It is still another object of the present invention to provide a synchronizer that overcomes or helps resolve the problem of the reduction of separation of two signals of two different cycles for two different agents wherein the reduction is a result of many factors such as noise of reference voltage, time compression effect of space time relativity, and delay element variation.

It is still a further object of the present invention to provide a synchronizer that has a design with control signal generation and noise margin of the synchronous latch that overcomes the reduction problem of the separation of the two signals.

The foregoing objects are achieved as is now described. A synchronizer used for providing a source synchronized clock bus with multiple agents wherein the synchronized bus reduces the effect of clock skew during the signal capturing process. Generally, a set of two latches coupled sequentially is used to latch and transfer data wherein the first latch is a capture latch and the second latch is a storage latch. The output of both of these two latches are fed selectively to the internal latch. Since strobe signals with a full differential are immune to reference voltage noise delay variation, the strobe signals from the sending chip are selected as the base of all controls. The present synchronizer comprises at least one capture latch in the capture clock domain for capturing the signal, at least one storage latch for storing the signal coupled to the at least one capture latch, a multiplexer coupled to the at least one storage latch wherein the multiplexer synchronizes data transfer of the at least one storage latch and the at least one capture latch, and an internal latch in the internal clock domain coupled to the multiplexer. The signal is controlled and processed by strobe signals and clock signals from the sending chip. A first group of control signals is used for latching data of the signal from the at least one storage latch and the at least one capture latch to the internal latch, and a second group of control signals is used for deriving the first group of control signals.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 6a is a block diagram illustrating the odd data signal transfer sequence for a short path that is transferred among the capture latch, storage latch, and internal latch for the timing diagram of FIG. 5a;

FIG. 6b is a block diagram illustrating the odd data signal transfer sequence for a long path that is transferred among the capture latch, storage latch, and internal latch for the timing diagram of FIG. 5a;

DETAILED DESCRIPTION OF ILLUSTRATIVE EMBODIMENT

The present invention provides a synchronizer 10 used for providing a source synchronized clock bus with multiple agents wherein the synchronized bus reduces the effect of clock skew during the signal capturing process. The present synchronizer 10 has features that overcome problems associated with prior art synchronizers, particularly the problem of the timing with the capture and transfer signals and the problem with the two signal separation being reduced by many factors. One key feature of the synchronizer 10 overcomes the signal transfer problem associated with path length variation. Generally, a set of two latches coupled sequentially is used to latch and transfer data wherein the first latch is a capture latch and the second latch is a storage latch. The output of both of these two latches are fed selectively to the internal latch. Another key feature of the synchronizer 10 overcomes the problem of the two signal separation being reduced by many factors. Since strobe signals with a full differential are immune to reference voltage noise delay variation (as well known from signal simulation analysis), the strobe signals from the sending chip are selected as the base of all controls (i.e. all control signal is derived from the strobe signals).

Figure 1:
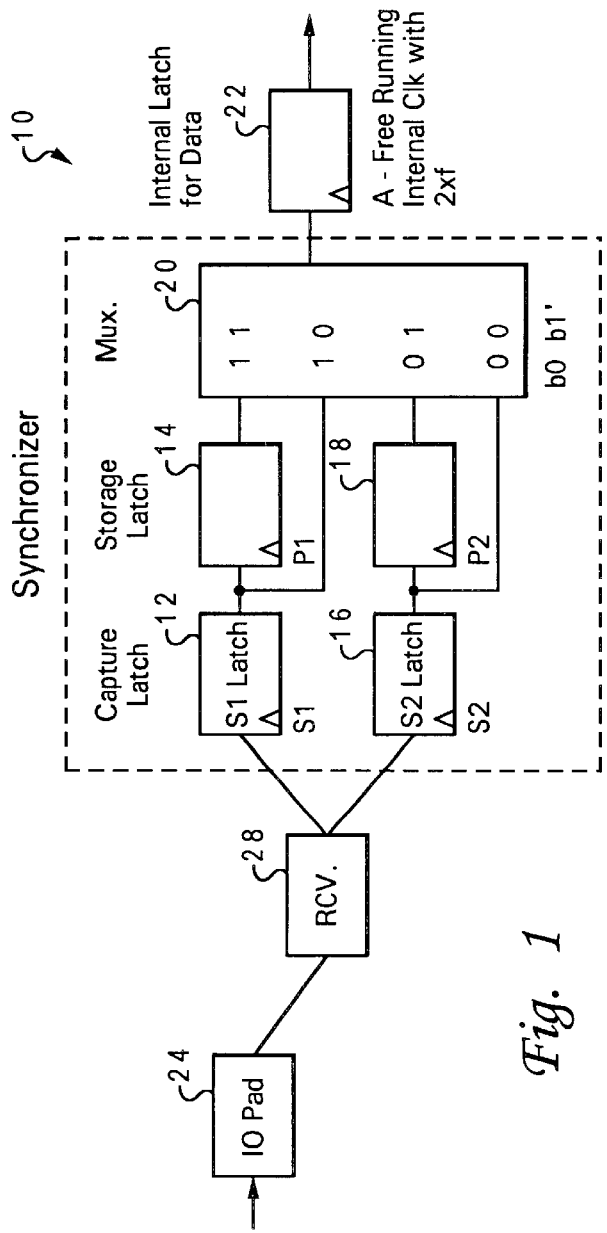
FIG. 1 is a block diagram of the present invention synchronizer for a source synchronized clock bus with multiple agents.

With reference now to the figures and in particular with reference to FIG. 1, the synchronizer 10 has capture and storage latches for capturing and storing signal data. FIG. 1 shows that the synchronizer 10 has two sets of latch pairs, a first set of capture and storage latches 12 and 14 and a second set of capture and storage latches 16 and 18. The first set of latches has a capture latch 12 coupled sequentially to a storage latch 14, and this latch set is used to latch and transfer data. The second set of latches has a capture latch 16 coupled sequentially to a storage latch 18, and this latch set is also used to latch and transfer data. The output of these latches are fed selectively to the internal latch 22. One set of such a latch pair is used for odd data capture and transfer while the other set of a latch pair is used for even data capture and transfer.

However, the assignment for even or odd data latch switches from a transfer cycle to another transfer cycle to account for phase change of the strobe signal. The selection of the output of these two latches in the latch pair to the input of the internal latch is based upon the result of a testing circuit between the incoming signal timing and a timing mark based on the internal clock timing. A valid bit '1' will be generated for each sub group of the bus signal. The data is valid if the valid bit is '1'. To generate a signal with precise timing, the control signals of the circuit for synchronizer 10 are derived from the combination of internal clocks and strobe signals. A burst instruction bit register is provided and set up for the synchronizer 10. The beginning of the transfer process of the data signal is triggered by the strobe signal and confirmed through the common clock signals from the sending chip. The end of the transfer is signified by a '0' burst instruction bit.

Each assertive burst instruction bit, '1' signal, represents a transfer of 16 bytes (8 byte bus).

Figure 3:
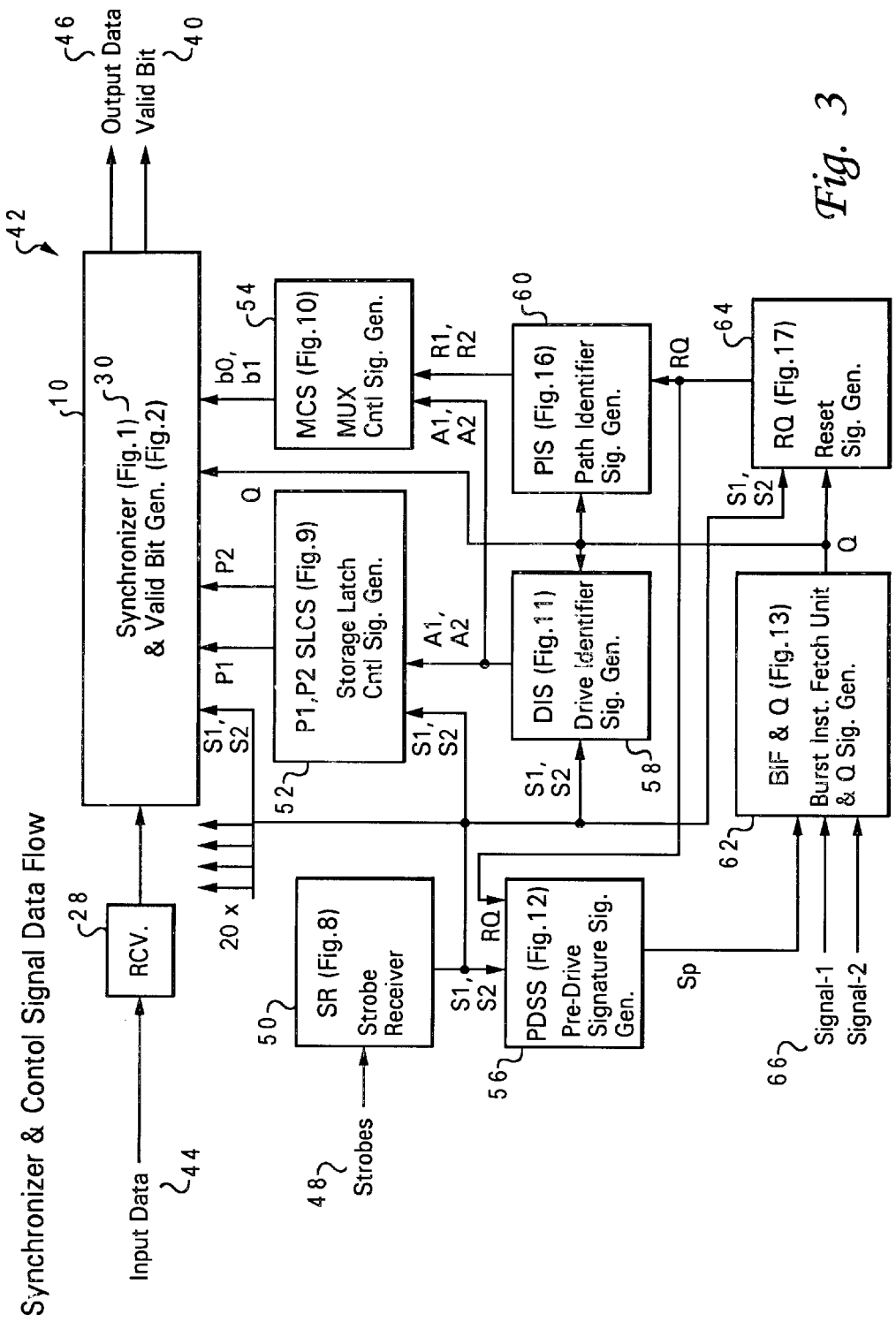
FIG. 3 is a block diagram of the data flow of the control signals for the present invention synchronizer.

In FIG. 1, a block diagram of the present synchronizer 10 is shown. The synchronizer 10 has two latch pairs (i.e. latch pair 12 and 14 and latch pair 16 and 18), a multiplexer 20, and an internal latch 22. Each latch pair has a capture latch (i.e. capture latch 12 or 16) and a storage latch (i.e. storage latch 14 or 18). Each latch pair is able to either receive odd or even data. All the latches described in the figures are positive trigger latches, but negative trigger latches may also be used. S1 and S2 are the two clocking signals for the capture latches 12 and 16 respectively and are the two output signals of the strobe receiver 50 (FIG. 3). The P1 and P2 are two clock signals which are used to latch the signal into the storage latches 14 and 18 respectively. The clock signal is either bus or bus complementary depending on whether S1 or S2 is odd or even data. With the appropriate timing, the signals b0 and b1 are used to selectively open the timing of the paths for the 4 to 1 multiplexer 20. The generation of these signals P1, P2, b0, and b1 are described in more detail later. Also, the synchronizer 10 is coupled to a sending chip data receiver 28 at the capture latches 12 and 16. The data receiver 28 is coupled to an input/output (I/O) pads 24.

With respect to signal timing and transfer sequence, the operation of the latch pair 12 and 14 or the latch pair 16 and 18 is to account for the timing problem associated with a long or short path as discussed earlier in the description of the related art section.

Figure 5A:
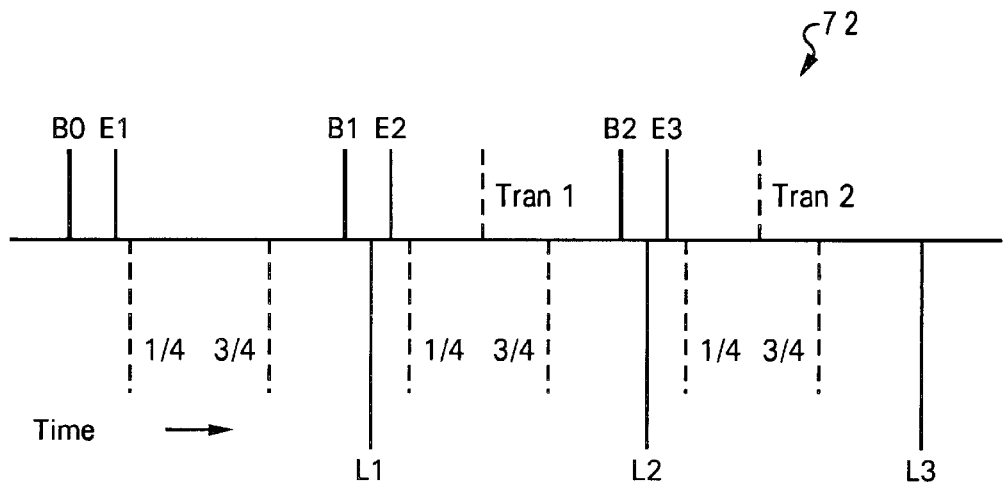
FIG. 5a is a timing diagram of the transfer boundary times for an example set of short and long path signals.
Figure 6A:
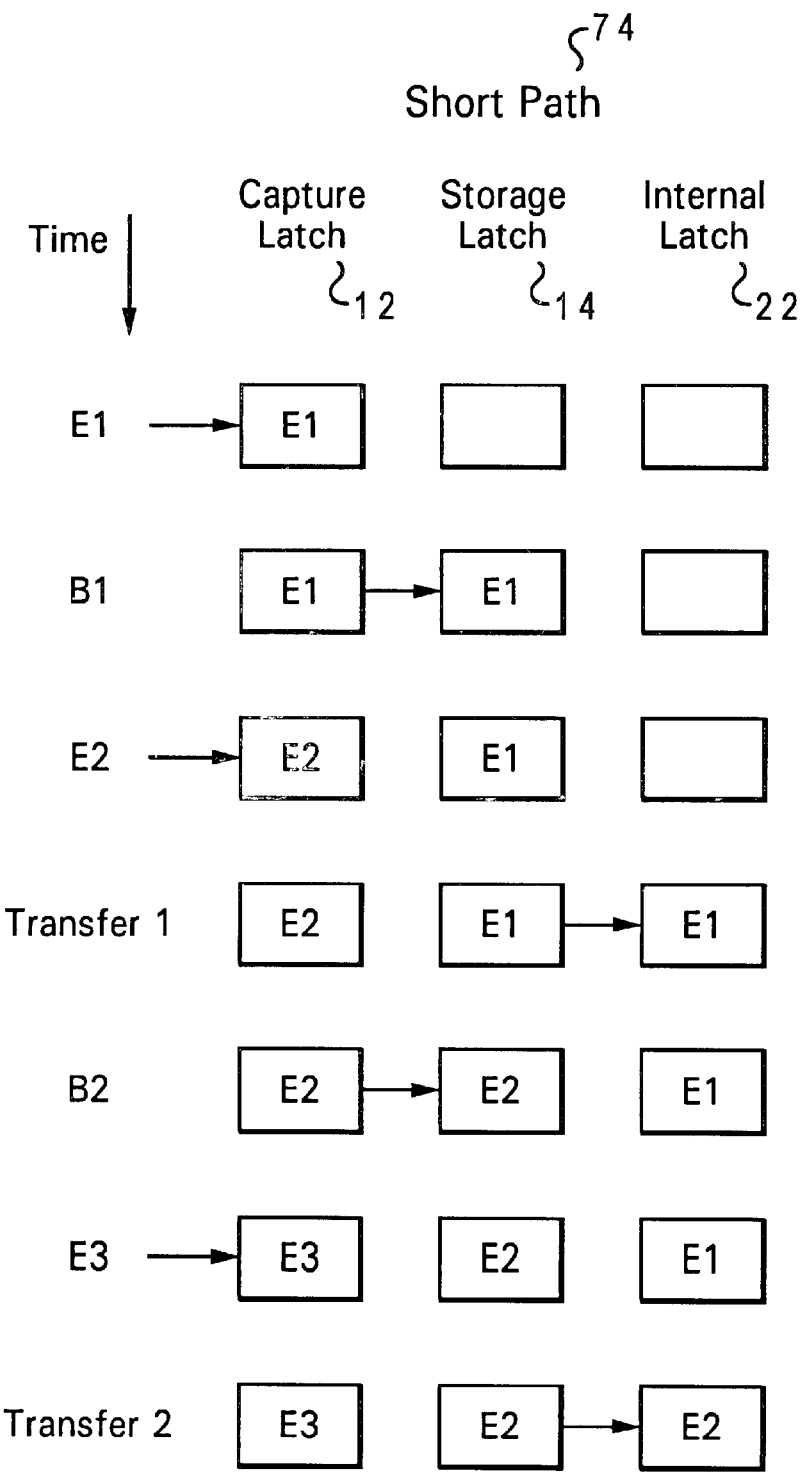

With reference to FIGS. 5a, 6a, and 6b, the signal timing and transfer sequence for an example set of short and long path signals is described as follows: At time E1, the signal of the first cycle for the short path 74 is captured by capture latch 12. At first cycle boundary time B1, the first cycle signal for the short path 74 is transferred from the capture latch 12 to the storage latch 14. At time L1, the capture latch 12 captures the first cycle for the long path 76. At time E2, the capture latch 12 captures the signal of the second cycle for the short path 74, and the storage latch 14 still has stored in it the first cycle signal from time E1. At transfer time 1 ("Transfer 1"), the first cycle signal for the short path 74 from time E1 is transferred from the storage latch 14 to the internal latch 22. Also, at transfer time 1 ("Transfer 1"), the first cycle signal for the long path 76 from time L1 is transferred from the capture latch 12 to the internal latch 22. At second cycle boundary time B2, the second cycle signal for the short path 74 from time E2 is transferred from the capture latch 12 to the storage latch 14, and the internal latch 22 still has the first cycle signal from time E1 for the short path 74. At time L2, capture latch 12 captures the second cycle signal for the long path 76, and the internal latch 22 still has the first cycle signal from time L1 for the long path 76. At time E3, the capture latch 12 captures the third cycle signal for the short path 74. At time E3, the storage latch 14 still has the second cycle signal from time E2 for the short path 74, and the internal latch 22 still has the first cycle signal from time E1 for the short path 74. At transfer time 2 ("Transfer 2"), the second cycle signal for the short path 74 from time E2 is transferred from the storage latch 14 to the internal latch 22. At transfer time 2, the third cycle signal for the short path 74 from time E3 is still in the capture latch 12. Also, at transfer time 2, the second cycle for the long path 76 from time L2 is transferred from the capture latch 12 to the internal latch 22.

Figure 5B:
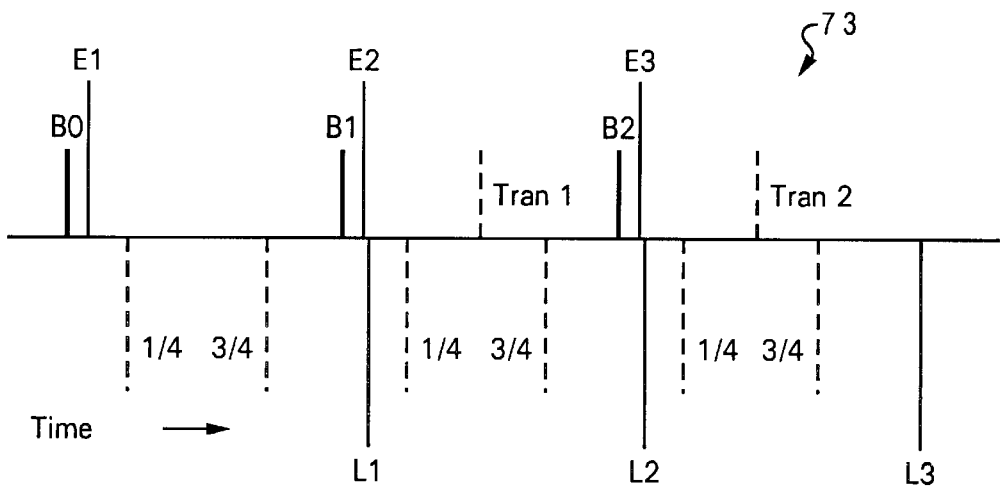
FIG. 5b is another timing diagram of the transfer boundary times for another example set of short and long path signals.
Figure 6C:
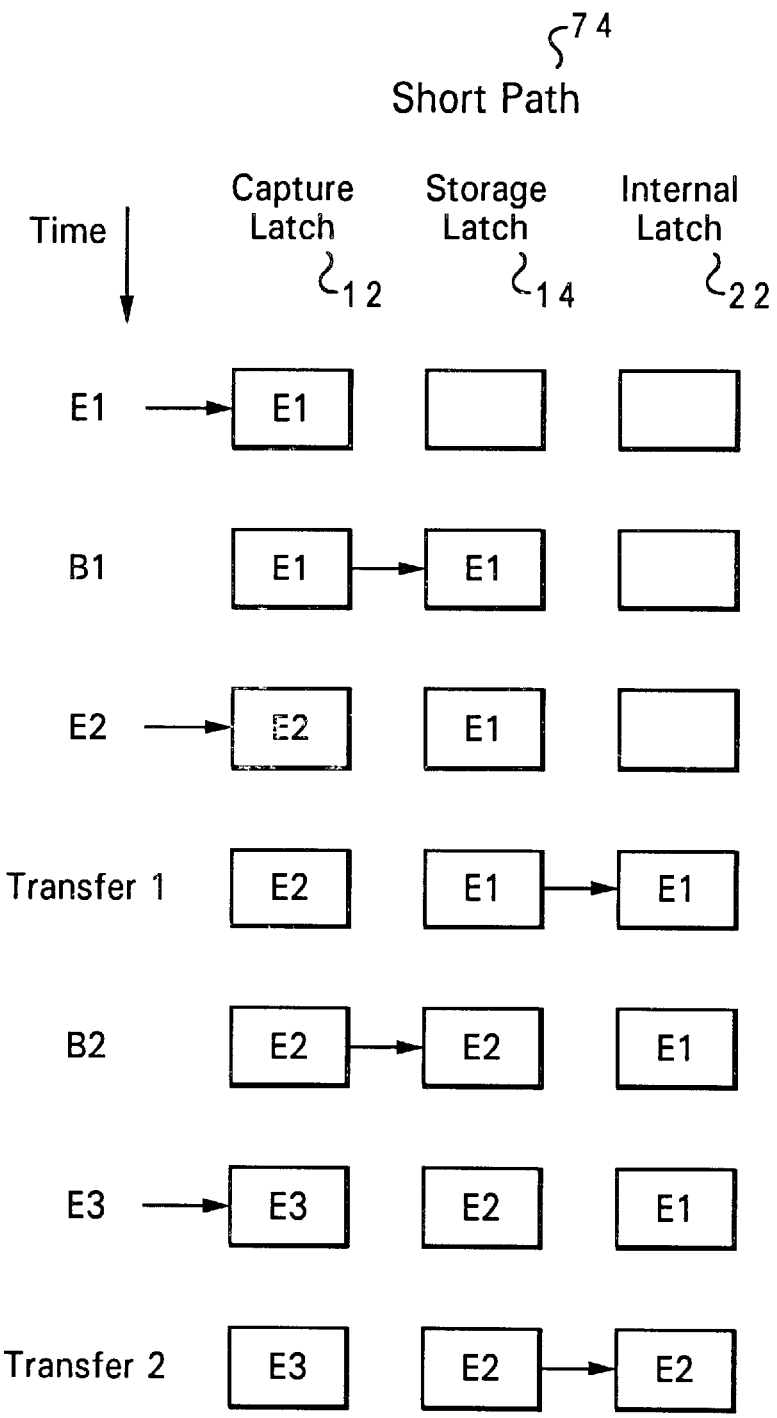
FIG. 6c is a block diagram illustrating the odd data signal transfer sequence for a short path that is transferred among the capture latch, storage latch, and internal latch for the timing diagram of FIG. 5b.
Figure 6D:
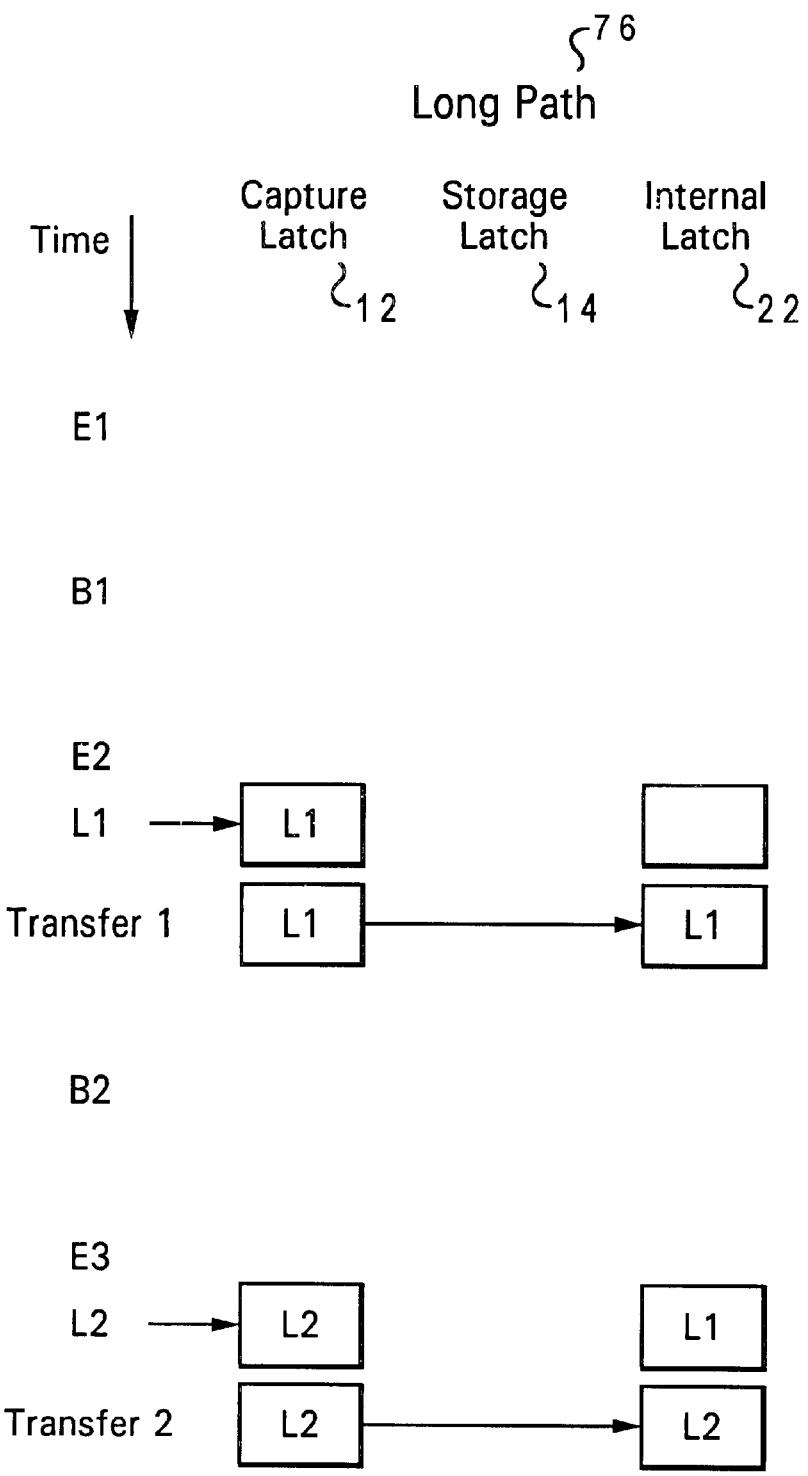
FIG. 6d is a block diagram illustrating the odd data signal transfer sequence for a long path that is transferred among the capture latch, storage latch, and internal latch for the timing diagram of FIG. 5b.

With reference to FIGS. 5b, 6c, and 6d, the signal timing and transfer sequence for another set of short and long path signals is described as follows: At time E1, the signal of the first cycle (i.e. cycle between time B0 and B1) for the short path 74 is captured by capture latch 12. At first cycle boundary time B1, the first cycle signal for the short path 74 is transferred from the capture latch 12 to the storage latch 14. At time E2, the capture latch 12 captures the signal of the second cycle (i.e. cycle between times B1 and B2) for the short path 74, and the storage latch 14 still has stored in it the first cycle signal from time E1. At time L1, the capture latch 12 captures the first cycle (i.e. cycle between times B1 and B2) for the long path 76. At transfer time 1 ("Transfer 1"), the first cycle signal from time E1 for the short path 74 is transferred from the storage latch 14 to the internal latch 22. Also, at transfer time 1 ("Transfer 1"), the first cycle signal for the long path 76 from time L1 is transferred from the capture latch 12 to the internal latch 22. At time B2, the second cycle signal for the short path 74 from time E2 is transferred from the capture latch 12 to the storage latch 14, and the internal latch 22 still has the first cycle signal from time E1 for the short path 74. At time E3, the capture latch 12 captures the third cycle signal for the short path 74. At time E3, the storage latch 14 still has the second cycle signal for the short path 74 from time E2, and the internal latch 22 still has the first cycle signal for the short path 74 from time E1. At time L2, capture latch 12 captures the second cycle signal for the long path 76, and the internal latch 22 still has the first cycle signal for the long path 76 from time L1. At transfer time 2 ("Transfer 2"), the second cycle signal for the short path 74 from time E2 is transferred from the storage latch 14 to the internal latch 22. At transfer time 2, the third cycle signal for the short path 74 from time E3 is still in the capture latch 12. Also, at transfer time 2, the second cycle for the long path 76 from time L2 is transferred from the capture latch 12 to the internal latch 22.

The above examples are for sequential transfers of odd data signals. For the even data signals, the sequence of signal transfer is the same as the odd data signal with two exceptions. First, the data is transferred to the storage latch 14 at the middle of the cycle, and second, the signal is latched in the internal latch 22 at the end of a second cycle at time B2.

Figure 16:
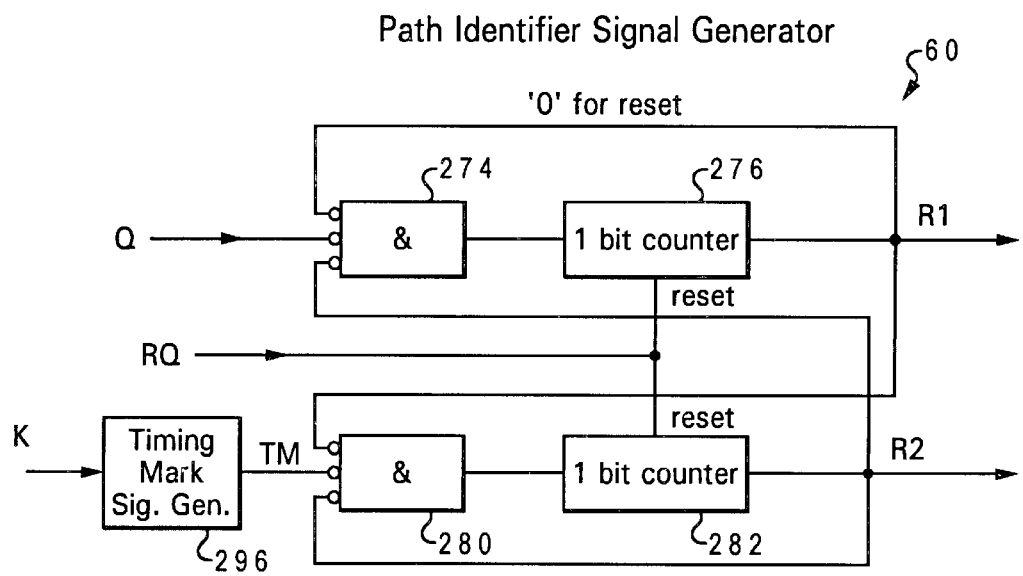
FIG. 16 is a path identifier signal generator for generating path identifier signals R1, R2, which are group 2 signals.
Figure 18:
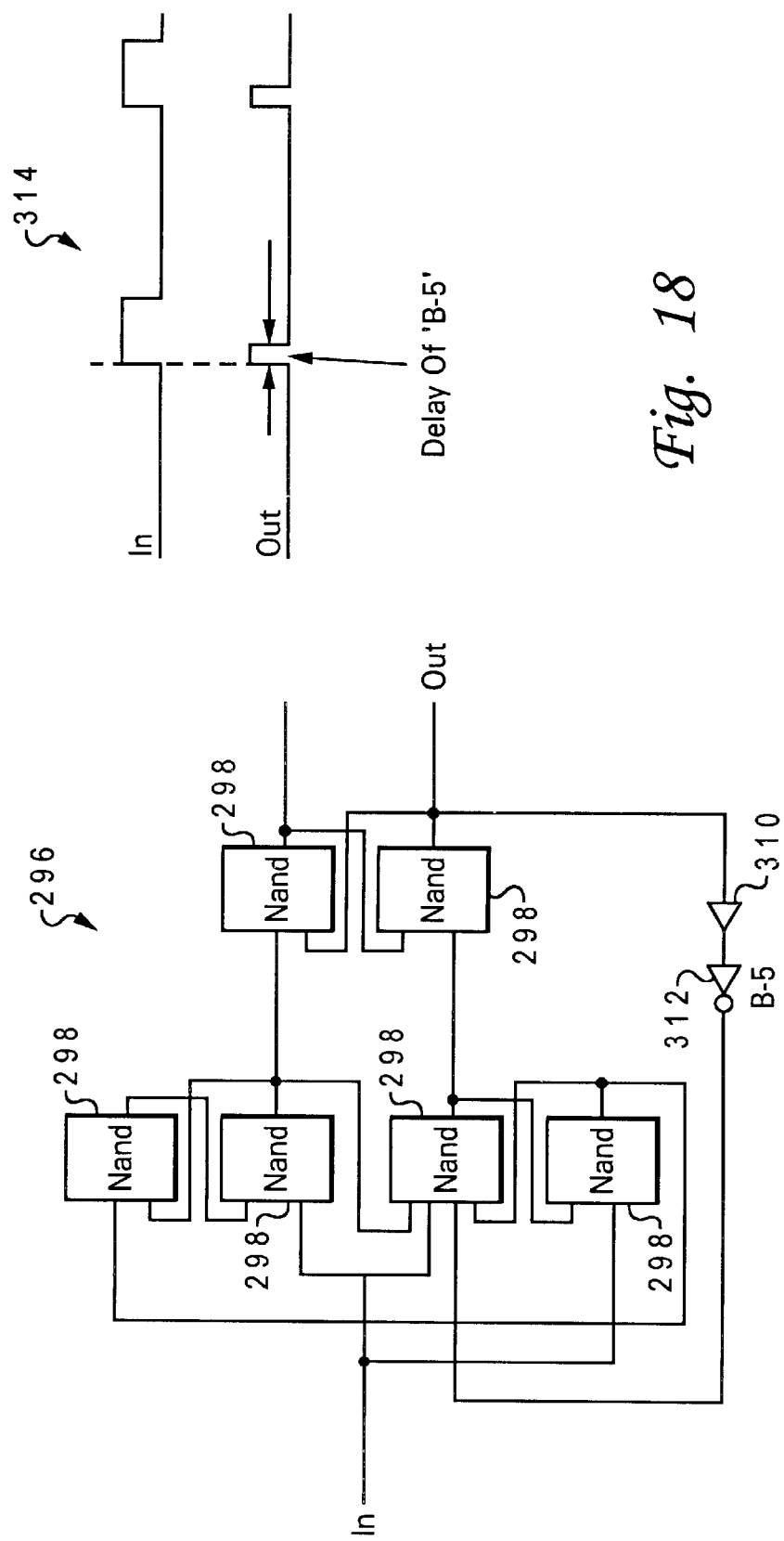
FIG. 18 is a block diagram of a timing mark signal generator for generating a timing mark signal.

A circuit to test the timing between the signal and the timing mark is used to determine the identification and classification of these signals, that is, to determine whether the signal is a short path signal or long path signal. Such a circuit is shown in FIG. 16 as a path identifier circuit 60, and this circuit 60 will be described later in more detail. The timing used for the testing is a timing marker with ¾ of the cycle behind the leading edge of the first bus cycle (i.e. cycle between times B0 and B1) wherein the timing marker signal is generated by a timing marker signal generator (i.e. see FIGS. 7 and 18). Such a timing marker is chosen because it allows the maximum testing error tolerance, which is a ¼ cycle error allowance.

Multiple agents are able to couple to the source synchronized clock bus wherein the bus is synchronized by the synchronizer 10. For example, an agent A may own the bus of the first cycle (i.e. cycle between time B0 and B1), and an agent B may own it for the second cycle (i.e. cycle between time B1 and B2). Also, a dead cycle separation exists between the first cycle transfer and the second cycle transfer. Agent C is the target for both the first and the second cycle data transfer. Agent A is far away from agent C while agent B is near by agent C. For a one cycle bus turn around time, the minimum separation of any two signals is one bus cycle in absolute time scale (based on bus clock). From the observation point of agent C, the first transfer signal takes a longer time to arrive than the second transfer signal, and it therefore observes that the separation between two signals is less than one cycle. The difference is the propagation difference from A to C and from B to C. The effect is referred to as the timing compression effect. In a real environment, the signal separation is affected by more than the timing compression effect. It usually includes many different delay variations. Overall, the separation of two signals is much less than one cycle. One of the key and significant delay variation is the receiver delay variation caused by noise in the reference voltage source. Thus, in order to generate a valid bit to identify the validity of the data or to generate control signals to identify and characterize either the signal origin (from long path or from short path) or data sequence (odd data or even data for S1 or S2 latch), a signal from the sending chip is required to define the transfer signal valid window. From signal simulation analysis, strobe signals with full differential amplifier receivers are relatively immune to reference voltage noise delay variation. The elimination of such a significant delay variation factor increases the signal separation. For this reason, the strobe signals from the sending chip is selected as the base of all control signals (i.e. all control signals are derived from the strobe signals).

With reference now to the figures and in particular with reference to FIG. 3, a block diagram 42 of the data flow of the control signals for the synchronizer 10 is shown. The control signals include: 1) strobe signals; 2) group 1 control signals; and 3) group 2 control signals. The strobe signals S1 and S2 are received from the sending chip. The strobe receiver 50 is a full differential amplifier receiver.

Generally, the main operation of the Group 1 control signals is to direct the transfer of the data latched in the synchronized latch to the internal latch 22 in proper timing and sequence. Group 1 control signals are fed directly into the synchronizer 10. The Group 1 control signals include the storage latch control signals P1, P2, the multiplexer (mux) control signals b0, b1, and the valid bit. Also, generally, the main operation of the Group 2 control signals is to generate a set of control signals to derive the Group 1 control signals. The Group 2 control signals are fed to the Group 1 control signal generators. The Group 2 control signals are derived from the signals of strobes, burst instruction bit, and the free running clocks. Group 2 control signals include pre-drive signature signal Sp, counter reset signal Q, path identifier signals R1, R2, drive identifier signals A1, A2, counter reset signal RQ, and timing mark signal TM.

Referring to FIG. 3, the input data 44 having the signal to be synchronized is fed into the receiver 28.

The receiver 28 is coupled to the block having the synchronizer 10. The block with the synchronizer 10 outputs an output data having the synchronized signal. A valid bit is also fed into another receiver 32A an coupled into bit generator 30. The group 1 signals control the synchronizer 10 and the valid bit generator 30, and the group 2 signals, in turn, control the group 1 signals. The strobe signals S1, S2 from the sending chip are used as the base of all control signals to eliminate any significant delay variation factor so that signal separation is increased.

Figure 8:
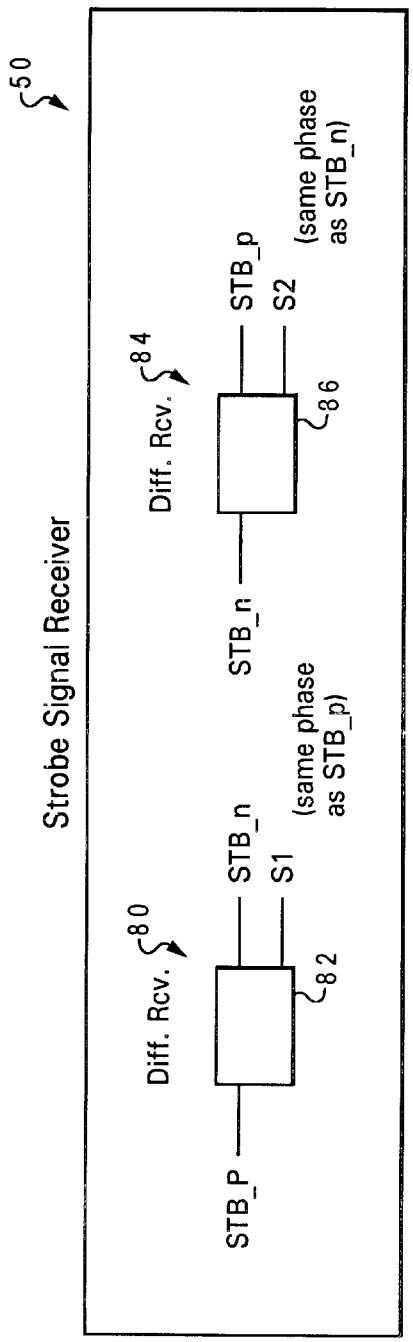
FIG. 8 are block diagrams of the strobe signal receivers.
Figure 17:
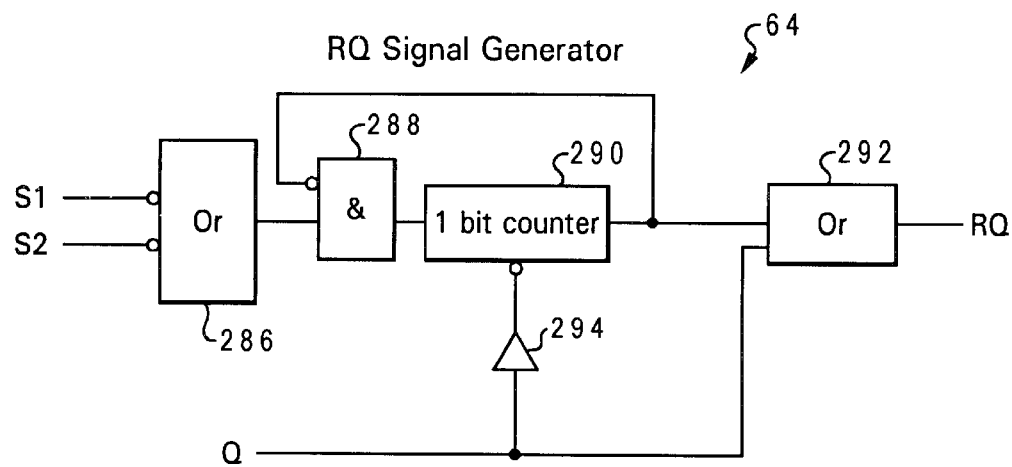
FIG. 17 is a reset (RQ) signal generator for generating a reset signal RQ, which is a group 2 signal.

The strobe signals S1, S2 (Strobe Signals 48) are received at the strobe receiver (SR) 50. The details of the SR 50 is shown in FIG. 8. The strobe signals S1, S2 are fed into the synchronizer 10 (see FIG. 1), a storage latch control signal generator 52 (see FIG. 9), a drive identifier signal (DIS) generator 58 (see FIG. 11), a pre-drive signature signal generator 56 (see FIG. 12), and a reset signal generator 64 (see FIG. 17). The pre-drive signature signal generator generates the pre-drive signature signal Sp (Group 2 signal).

The pre-drive signature signal Sp along with signal 66 from the sending chip are fed into a Burst Instruction Fetch Unit and Q (BIF&Q) signal generator 62. The BIF&Q signal generator 62 is shown in more detail in FIG. 13. The BIF&Q signal generator 62 generates the counter reset signal Q (Group 2 signal) from its input signals. The reset signal Q is fed into the synchronizer 10, valid bit generator 30, the drive identifier signal generator (DIS) 58, the path identifier signal generator 60 (see FIG. 16), and the reset signal generator 64 (see FIG. 17).

The reset signal generator 64 generates the counter reset signal RQ (Group 2 signal). The RQ signal is fed into the path identifier signal generator 60 (see FIG. 16) and into the pre-drive signature signal generator 56. The drive identifier signal generator 58 generates the drive identifier signals A1, A2 (Group 2 signals). The drive identifier signals A1, A2 are fed into a storage latch control signal generator 52 (see FIG. 9) and a multiplexer (mux) control signal generator 54 (see Figure 10). The path identifier signal generator 60 generates path identifier signals R1, R2 (Group 2 signals), and these signals are fed into the mux control signal generator 54. The storage latch control signal generator 52 generates the storage latch control signals P1, P2 (Group 1 signals) from its inputs, and these signals are fed into the synchronizer 10. The mux control signal generator 54 generates the multiplexer (mux) control signals b0, b1 (Group 1 signals), and these signals are fed into the synchronizer 10. From the input signals and data, the synchronizer 10 generates output data, that is a synchronized signal of the input data. The valid bit generator 30 generates a valid bit signal that validates the data.

The strobe signals are sent from the sending chip. Referring to FIG. 8, the strobe receiver block 50 comprises differential amplifier receivers 80 and 84, and these amplifier receivers 80 and 84 respectively generate the strobe signals S1, S2. The phase relation of the strobe signals S1 and S2 with respect to the incoming strobe signals, strobe_p and strobe_n, is illustrated in FIG. 8. FIG. 8 shows the differential amplifier receivers 80 and 84 with respective differential amplifiers 82 and 86. The differential amplifier receivers 80 and 84 are used because they have high noise immunity.

The circuits into which the S1 and S2 signals are fed include twenty capture latch pairs and signal generators for generating Group 2 control signals. These signal generators are the drive identifier (DI) signal generator 58 shown in FIG. 11, the pre-drive signature signal generator 56 shown in FIG. 12, and the RQ signal generator 64 shown in FIG. 17. The signals S1 and S2 are also fed to the synchronizer 10 shown in FIG. 1 and is used for the latching incoming signal.

Since a heavy loading condition exists, a buffer is used to beef up the drive capability. For tracking the delay between data and strobe, a buffer with the same delay is inserted in the data lines. Since a large number of capture latch pairs (twenty in this case) exists, the variation of a RC delay is significant. The set up and hold times of the signal with respect to strobe must be improved. A buffer insertion (placing in input/output (I/O) cell) is the most commonly used technique to compensate the delay of short RC delay net.

Referring to FIG. 8, in order to maintain the specification of one dead cycle for the bus owner switch, the strobe signals requires phase change for bus owner changes. If strobe_p is the pre-drive strobe, then the latch S1 shown in FIG. 1 latches the odd data and the latch S2 latches the even data. If strobe_n is the pre-drive signal, then the data latched by the S1 and S2 latches will be reversed. Such a requirement has caused significant complication for control signal generation as described later.

FIG. 1 shows the control signals of the synchronizer 10, which are the output signals from the Group 1 signal generator. The output signals are P1, P2, b0, b1, and the valid bit. The input signals of the Group 1 signal generator are A1, A2, R1, R2, and a set of free running clocks that have timings shown in the timing graph 70 of FIG. 4. These signals and the signal generators for the synchronizer 10 are discussed as follows:

For a short path signal, if the data at the S1 latch is odd data, the storage latch 14 or 18 should latch the signal at the first cycle boundary B1 and hold the signal for at least half a cycle plus the clock skew. Therefore, a bus clock is used for the P1 signal for at least the first half of the second cycle (i.e. cycle between times B1 and B2). The data in the S2 latch is even data, and the storage latch 14 or 18 for this path latches the data at the middle of the second cycle (i.e. cycle between time B1 and B2) and holds the data again until the end of the second cycle (i.e. cycle between times B1 and B2).

Figure 11:
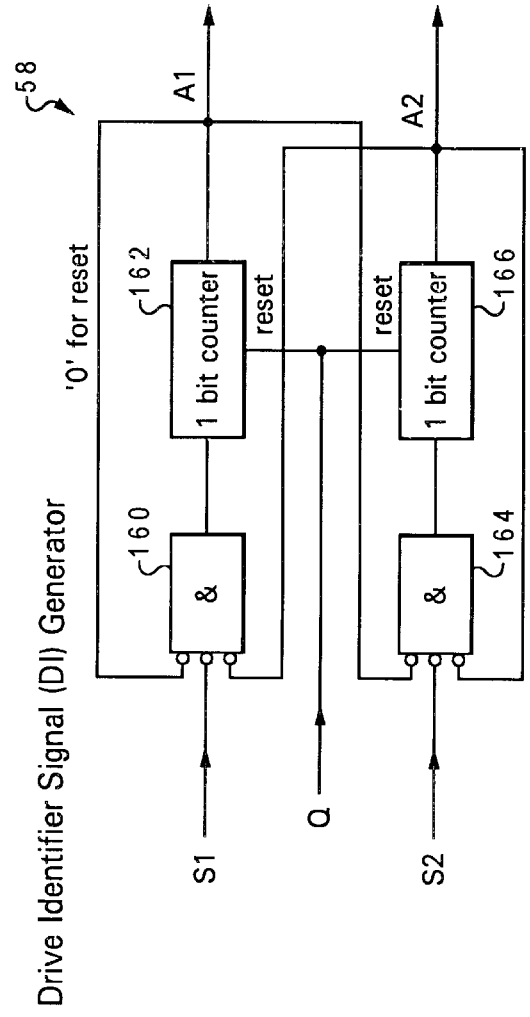
FIG. 11 is a block diagram of the drive identifier (DI) signal generator for generating the drive identifier signals A1, A2, which are group 2 signals.

The signals A1 and A2 are generated from the drive identifier (DI) signal generator 58 as shown in FIG. 11. More details of the DI signal generator 58 will be provided later. When A1 is '1', then the data in the S1 latch is odd. When A1 is '0', then the data in the S1 latch is even. Signal A2 is complementary to signal A1. The signal valid window of either of these two signals spans the data valid window.

The main operation of the Group 1 control signals is to direct the transfer of the data latched in the synchronized latch (i.e. capture latch or storage latch) to the internal latch 22 in proper timing and sequence. The target of the latency is one and one half cycle. For example, the first bit of the data will be latched at the end of the second cycle. The main operation of the Group 2 signal generators is to generate a set of control signals to derive the Group 1 control signals.

Figure 9:
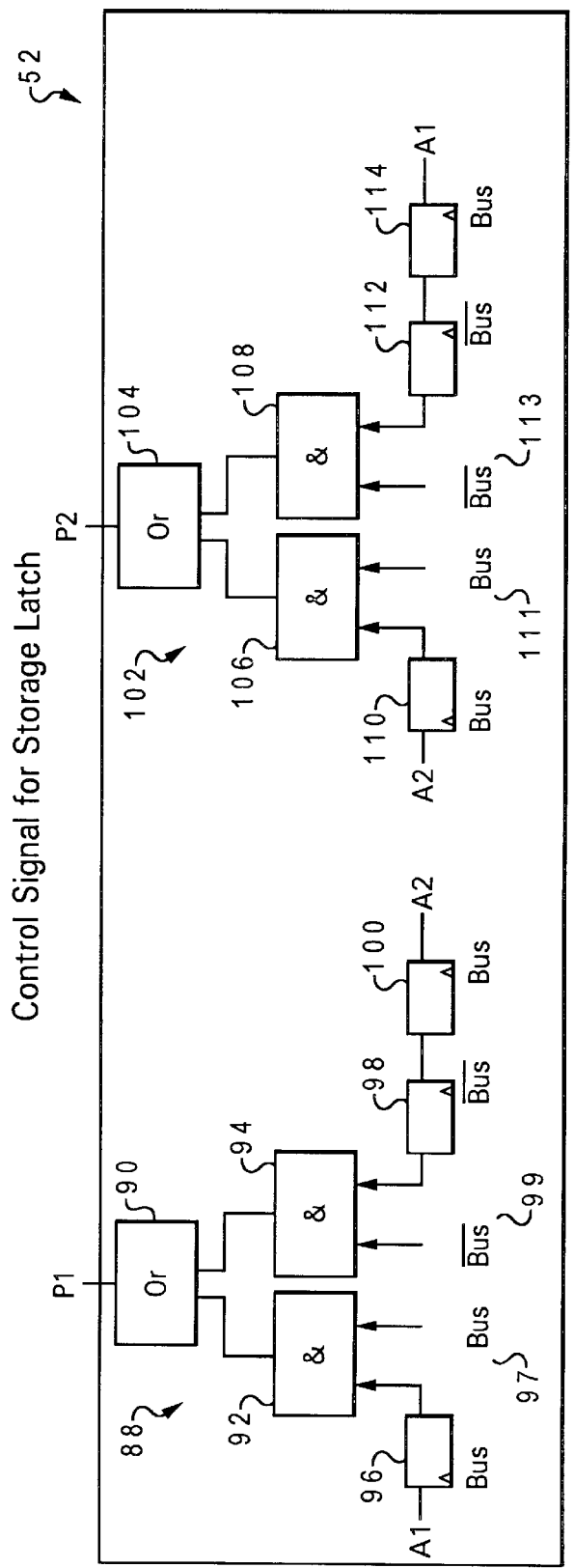
FIG. 9 is a block diagram of the storage latch control signal generator for generating storage latch control signals P1, P2, which are group 1 signals.

With reference now to the figures and in particular with reference to FIG. 9, the storage latch control signal generator 50 is shown in more detail. The storage latch control signal generator 50 comprises circuits 88 and 102, which are complementary circuits, and they respectively generate the storage latch control signals P1 and P2 according to the above condition utilizing the drive identifier signals A1 and A2 and the bus clock. Circuit 88 comprises bus inputs/interfaces 96, 97, 98, 99, and 100 wherein A1 is inputted into through bus interface 96 and A2 is inputted through the bus interfaces 100 and 98. The bus inputs/interfaces 96 and 97 are directly inputted into AND gate 92, and the bus inputs/interfaces 98 and 99 are directly inputted into the AND gate 94. Busses 98 and 99 are complementary to busses 96 and 97. The outputs of the AND gates 92 and 94 are fed into two inputs of the OR gate 90. The output of the OR gate 90 provides the storage latch control signal P1. Circuit 102 comprises bus inputs/interfaces 110, 111, 112, 113, and 114 wherein A1 is inputted into through bus interfaces 114 and 112 and A2 is inputted through the bus interface 110. The bus inputs/interfaces 110 and 111 are directly inputted into AND gate 106, and the bus inputs/interfaces 113 and 112 are directly inputted into the AND gate 108. The busses 112 and 113 are complementary to busses 110 and 111. The outputs of the AND gates 106 and 108 are fed into two inputs of the OR gate 104. The output of the OR gate 104 provides the storage latch control signal P2.

Figure 10:
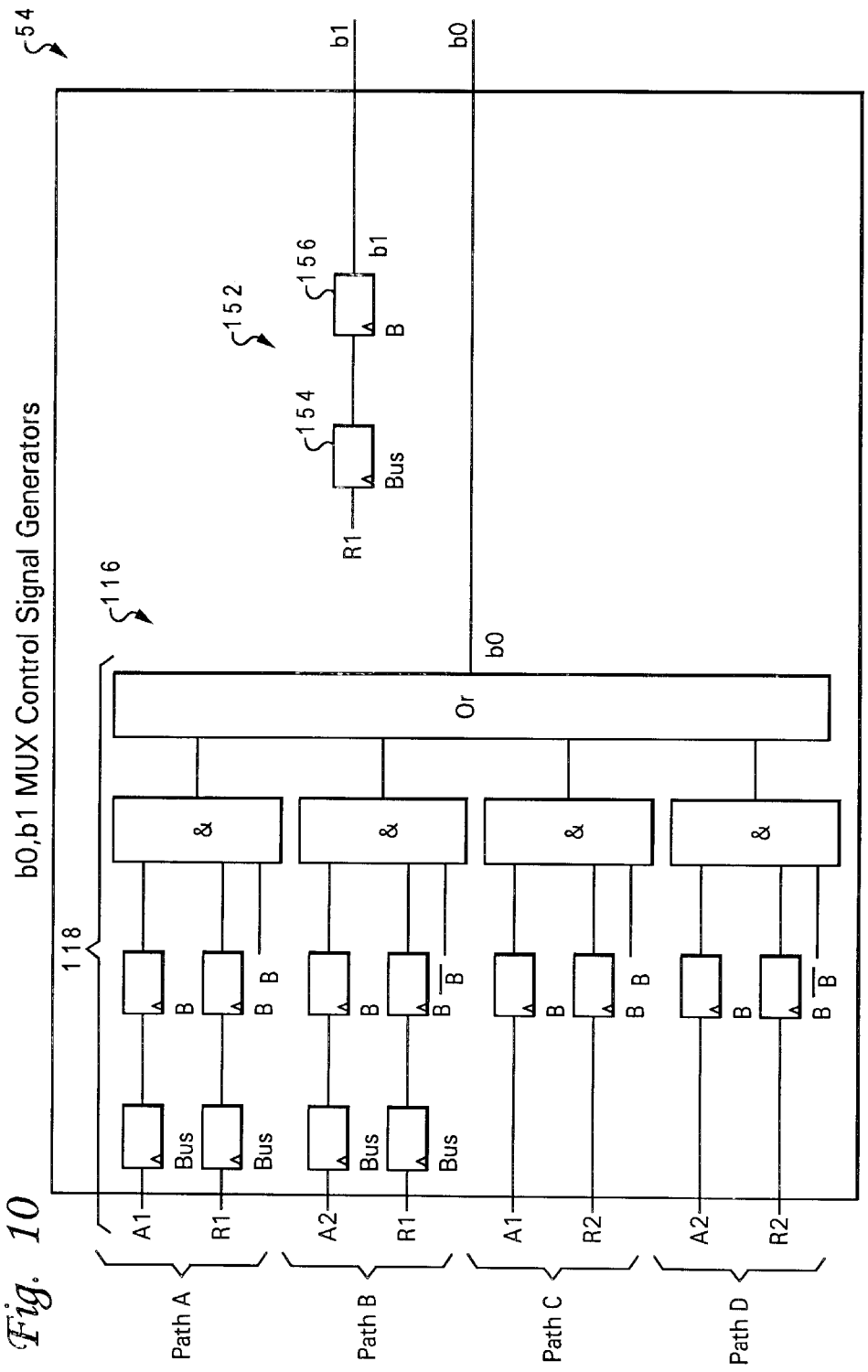
FIG. 10 is a block diagram of the multiplexer control signal generator for generating the multiplexer control signals b0, b1, which are group 1 signals.

With reference now to the figures and in particular with reference to FIG. 10, the multiplexer (mux) control signal generator 54 comprises control signal generators 116 and 152 for respectively generating multiplexer (mux) control signals b0, b1 are shown. The control signal generator 116 includes a 4-to-1 multiplexer (mux) 118 that is used to direct the signal from the capture latch 12 or 16 to the internal latch 22. The mux 118 comprises various bus interfaces/inputs, signal interfaces/inputs, AND gates, and a OR gate as shown in FIG. 10. The mux 118 has various respective input pairs (i.e. signal pairs A1 & R1; A2 & R1; A1 & R2; A2 & R2) and provides the output signal b0 from the output of the OR gate. Also, the control signal generator 152 has as its input signal R1. The generator 152 comprises bus interface/input 154 and signal interface/input 156. The generator 152 provides the output signal b1.

The control signal b0, b1 directs the connection of these four paths of the multiplexer 116 between the synchronized latch (i.e. capture latch or storage latch) to the internal latch in the correct timing to complete the signal transfer. The coding of the multiplexer (mux) control signals, the multiplexer (mux) path connection sequence for various signal transfer conditions, the multiplexer path connection sequence for various signal transfer conditions as well as the control circuit implementation are described.

With reference now to the figures and in particular with reference to FIG. 10, four signal paths of the multiplexer 118 that connects the synchronized latch to the internal register exist and are described as follows:

Path A is from the S1 latch (i.e. R1) through the storage latch for the short path signal (i.e. A1) to internal register and is coded as b0=1, b1=1;

Path B is from the S1 latch (i.e. R1) for the long path (i.e. A2) to the internal register and is b0=1, b1=0;

Path C is from the S2 latch (i.e. R2) through the storage latch for the short path signal (i.e. A1) to the internal register and is b0=0, b1=1; and Path D is from the S2 latch (i.e. R2) for the long path signal (A2) to the internal register and is b0=0, b1=1.

In a first case example, the signal transfer sequence is path A, path C, path A, path C . . . for A1=1, R1=1. A1 equaling one (1) means that the S1 latch receives odd data, and R1 equaling one (1) means that the signal is a short path signal. In a second case example, the signal transfer sequence is path C, path A, path C, path A . . . for A2=1, R1=1. A2 equaling one (1) means that the S2 latch receives odd data, and R1 equaling one (1) means that the signal is a short path signal. In a third case example, the signal transfer sequence is path B. path D, path B, path D . . . for A1=1, R2=1. R2 equaling one (1) means that the signal is a long path signal, and A1 equaling one (1) means that the S1 latch receives odd data. In a fourth case example, the signal transfer sequence is path D, path B, path D, path B . . . for A2=1, R2=1. A2 equaling one (1) means that the S2 latch receives odd data, and R2 equaling one (1) means that the signal is a long path signal.

The connection of each path has a duration of one half cycle. For the connection in the first case, the duration begins from ¼ cycle to ¾ cycle behind the first cycle boundary (B1). For the connection in the second case, the duration begins from the ¾ cycle behind the first cycle boundary (B1) to ¼ cycle behind the second cycle boundary (B2). The same pattern is repeated until the transfer process reaches its completion. FIG. 10 shows an example circuits that implements all of these conditions for the mux control signals b0, b1.

Figure 2:
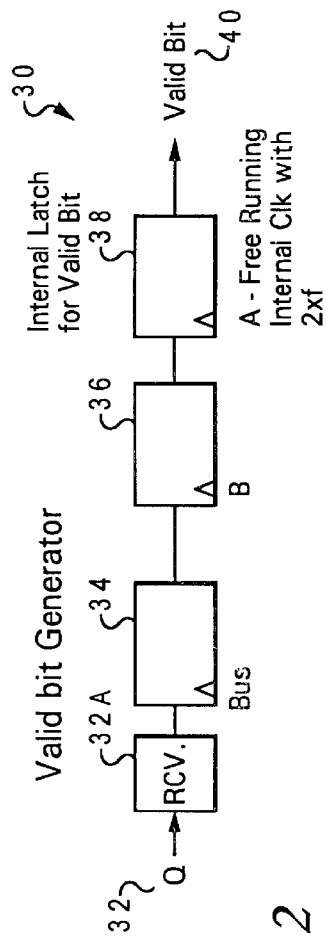
FIG. 2 is a block diagram of the valid bit generator for generating a valid bit, which is a group 1 signal, used for validating a signal.

In-order to insure the data integrity, a valid bit '1' signal is latched into the internal latch 22. The valid bit is used to detect the validity of the signal stored in the data internal latch 22. With reference now to the figures and in particular with reference to FIG. 2, a circuit 30 for the valid bit generator for generating the valid bit 40 is shown. The circuit 30 is used to generate the valid bit. In FIG. 2, the valid window of signal Q spans from the leading edge of the first bit received to the trailing edge of the last bit since the signal transfer latency of the data is one and one half cycles. Also, in FIG. 2, the circuit 30 comprises a clock bus register (i.e. Clock 'Bus') 34 and clock B register 36 (i.e. Clock 'B'). The two registers 34 and 36 are used to delay and extend the signal Q so that it will generate the valid bit. The circuit 30 also comprises a free running internal clock A register 38 having two times the frequency (2×f) of the signal. The register A is an internal latch for the valid bit.

Figure 4:
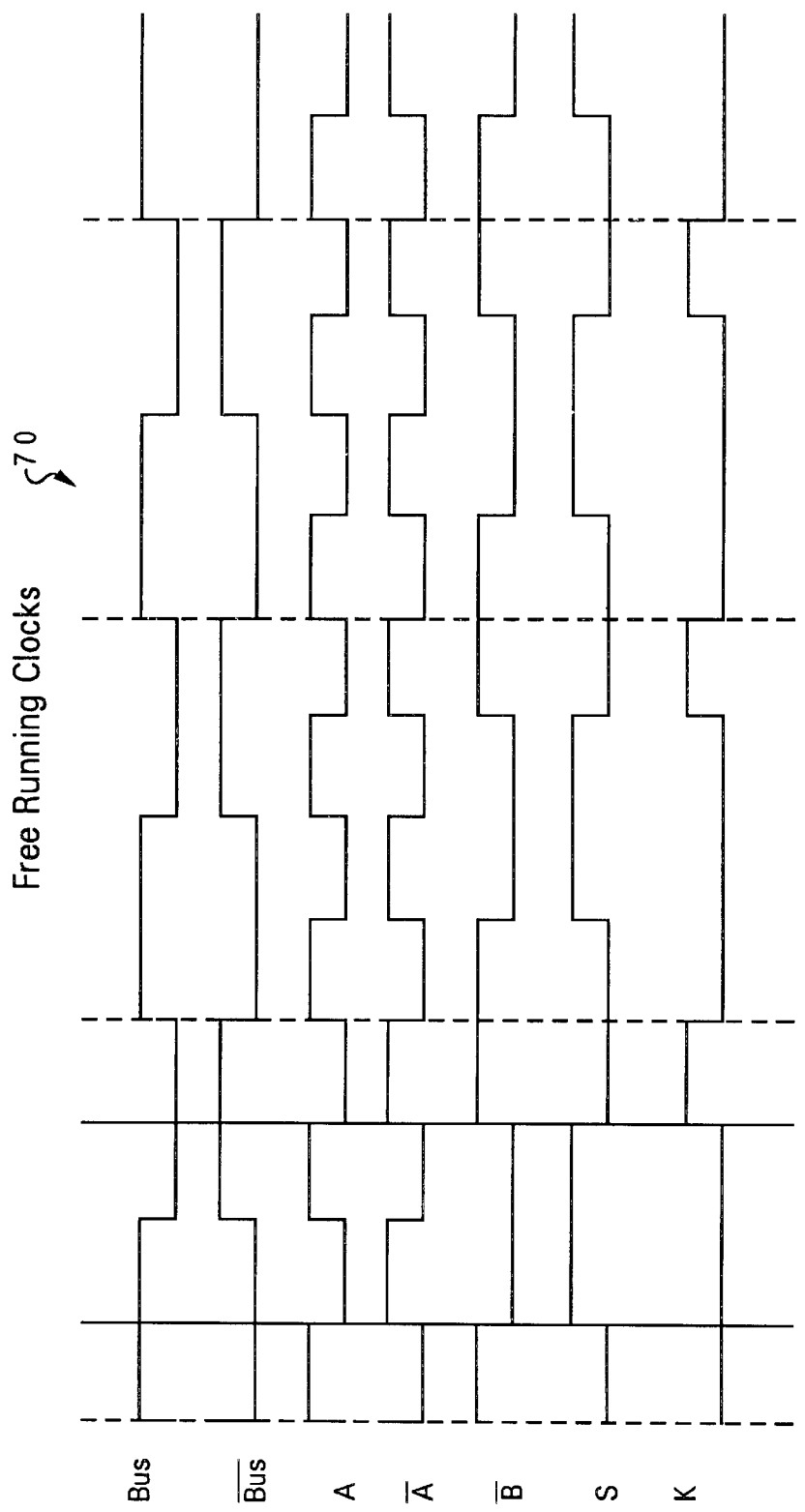
FIG. 4 is a timing diagram for the free running clocks

With reference now to the figures and in particular with reference to FIG. 4, a timing diagram 70 of the free running clocks B, Bus, A and respective complementary signals (i.e. in relation to the bus clock) is shown.

With reference now to the figures and in particular with reference to FIG. 11, strobe signals S1 and S2 are fed to the drive identifier (DI) signal generator 58 to generate drive identifier signals A1 and A2. If S1 is the pre-drive signal, then A1 is equal to '1'. Otherwise, A1 equals '0'. A2 is the complement to A1. The drive identifier circuit 58 is shown in FIG. 11. The circuit 58 includes two one bit asynchronous counters 162 and 166 each having a reset. A three (3) way AND gate 160 and a three (3) way AND gate 164 are respectively coupled to the counter 162 and the counter 166. An inverter is coupled in front of each of the three inputs of each gate 160 and 164. One of the inputs is fed by the strobe signal S1 or S2. The output of each counter 160 and 164 is fed back to the inputs of both AND gates 160 and 164 (i.e. a counter's own gate and the gate(s) of other counter(s)).

The signal Q is coupled to the reset terminals of both counters 162 and 166. After the last signal transfer, the reset signal Q resets both counters 162 and 166 to '0'. The AND gates 160 and 164 become open and ready for the incoming pre-drive signal Sp. The incoming pre-drive signal Sp increases the count of one of the counters 162 and 166 by one as soon as the Q signal goes up and releases the one counter. The output '1' of the one counter immediately closes both AND gates 160 and 164. A signal '0' appears at the other respective output. As the Q signal goes down, both counters 162 and 166 are cleared, and both AND gates 160 and 164 are open and ready for the initiation of another transfer process. Since either the S1 signal or the S2 signal precedes the signal Q, the valid signal window of either A1 or A2 is the same as that of the signal Q.

Figure 12:
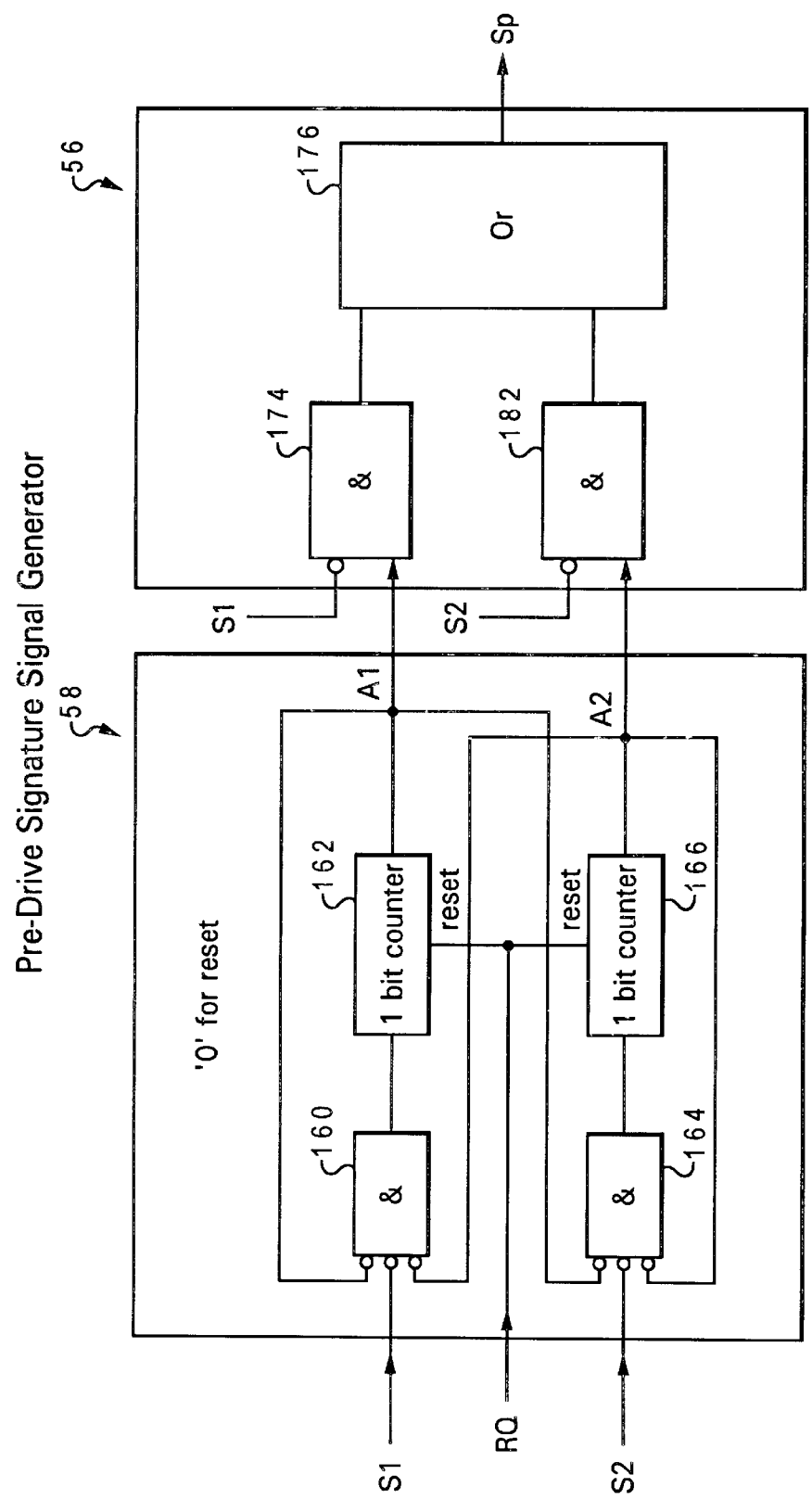
FIG. 12 is a block diagram of a pre-drive signal generator for generating the pre-drive signature signal Sp, which is a group 2 signal.

With reference now to the figures and in particular with reference to FIG. 12, the pre-drive signature signal (Sp) generator 56 for generating pre-drive signature signal Sp is shown. In combing the A1 and A2 signals, the pre-drive signal generator 56 generates the signal Sp (as shown in the timing diagram 78 of FIG. 7). The characteristics of the signal Sp are as follows: 1) The timing of the leading edge (rising edge) coincides with the leading edge (falling edge of the pre-drive signal Sp); and 2) The number of positive pulses is equal to the number of signals to be transferred.

FIG. 12 shows a simple circuit 56 for generating the signal Sp. The circuit 56 comprises the S1 and A1 signals being fed into an AND gate 174 and the S2 and A2 signals being fed into an AND gate 182. The outputs of the AND gates 174 and 182 are fed into OR gate 176. The output of the OR gate 176 provides the pre-drive signal Sp.

Figure 7:
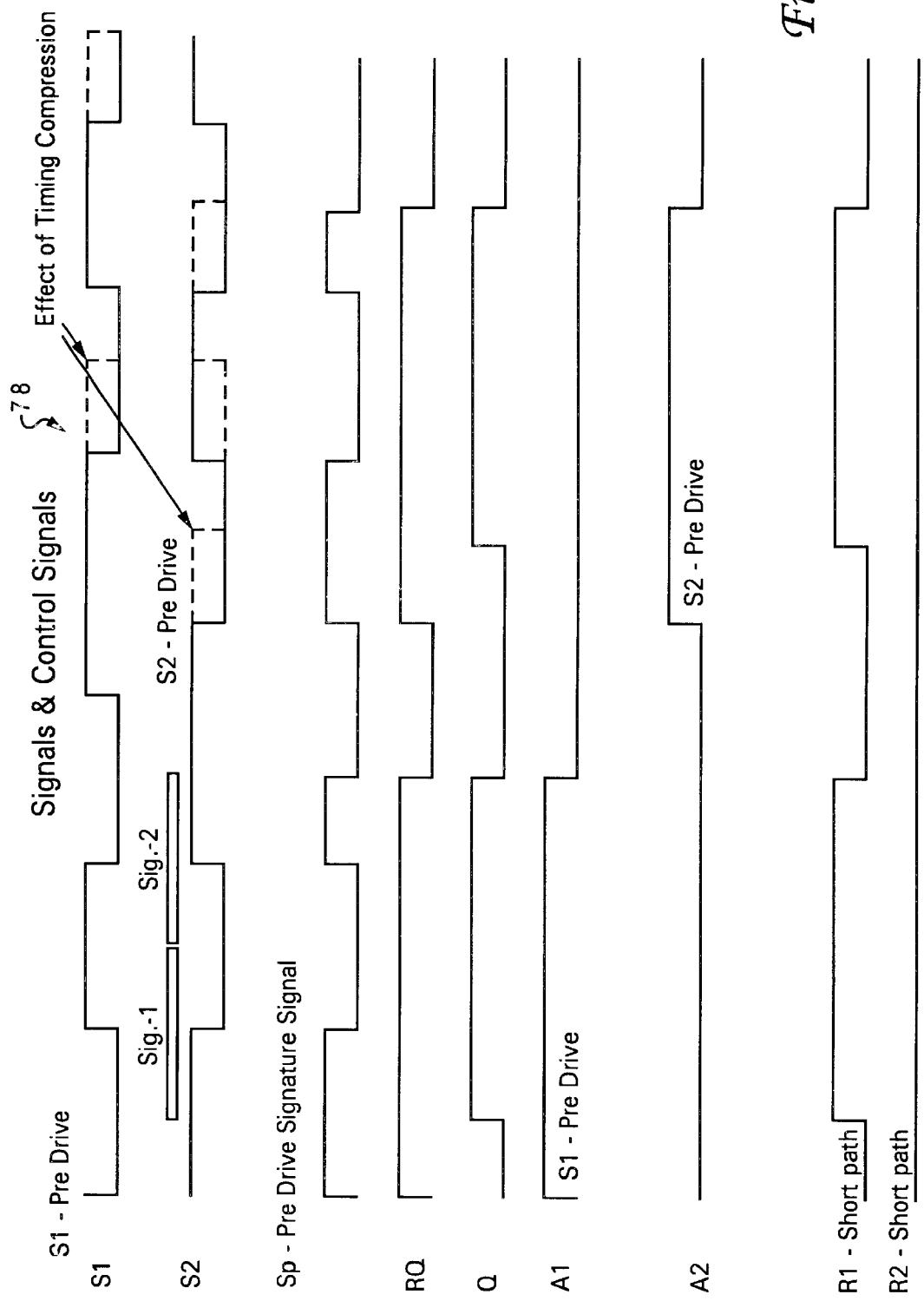
FIG. 7 is a timing diagram of at least some of the signals and control signals used in the present invention synchronizer.
Figure 13:
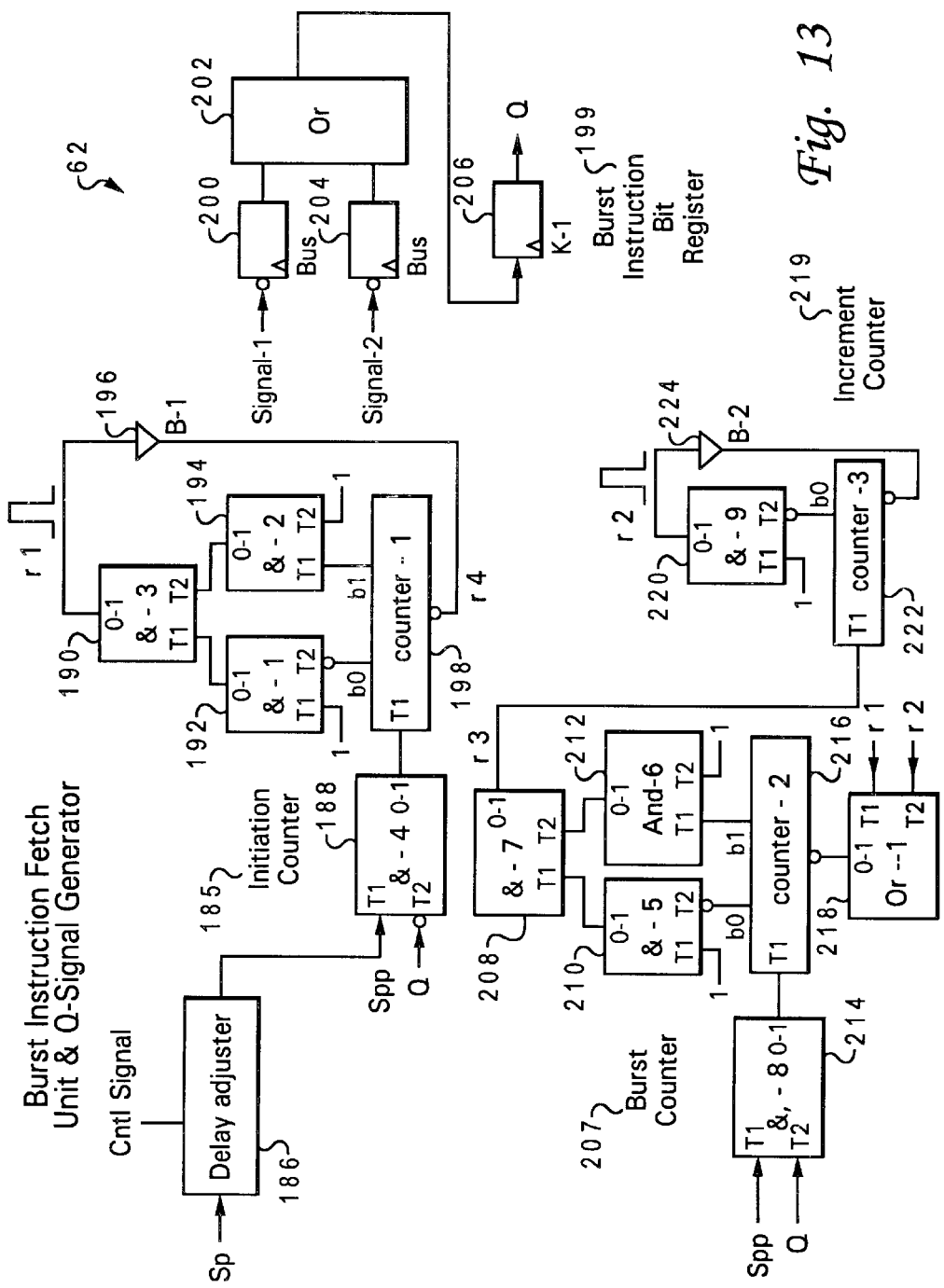
FIG. 13 is a block diagram of the Burst Instruction Fetch Unit and Q signal generator to generate a counter reset signal Q, which is a group 2 signal.

With reference now to the figures and in particular with reference to FIG. 13, a burst instruction fetch unit and Q (BIF&Q) signal generator 62 is shown. By counting the positive pulses of the delayed pre-drive signature signal Sp and by maintaining the signal from the burst instruction register as '1', the timing for the initiation and completion of the signal transfer is able to be defined. A signal Q characterizes such timing that is able to be generated (i.e. Q as shown in FIG. 7). The timing of the rising edge of the Q signal coincides with the leading edge of the first data received. The timing of the falling edge of the Q signal coincides with the trailing edge of the last data received. The block diagram of the unit 62 is shown in FIG. 13.

With reference now to the figures and in particular with reference to FIG. 13, the BIF&Q signal generator 62 generally comprises an initiation counter 185, a burst instruction bit register 199, a burst counter 207, and an increment counter 219. The initiation counter 185 comprises the pre-drive signal Sp and control signal being fed into a delay adjuster 186. A delayed pre-drive signal Spp is outputted from the delay adjuster 186 and input into a fourth AND gate 188 at input T1. The Q signal is inverted and inputted into the AND gate 188 at input T2. The output of the AND gate 188 is either a 0 or 1, and this output is fed into a counter-1 198 at input T1. The outputs of the counter-1 198 are the mux control signals b0, b1. A '1' and the b0 signal are fed into a first AND gate 192 at respective inputs T1 and T2. The b1 signal and a '1' are fed into a second AND gate 194. The outputs of the AND gates 192 and 194 are each either a '0' or a '1', and these outputs are respectively fed into a third AND gate 190 at inputs T1 and T2. The output of the third AND gate 190 is either a '0' or '1'. The output of the third AND gate 190 is a r1 signal fed into a delay buffer group B-1. The output from the delay buffer group B-1 is inverted to be a r4 signal, and this r4 signal is fed back into the counter-1 198.

The burst instruction bit register 199 generally comprises the clock signals each inverted and being fed into a bus interface/input 200 and a bus interface/input 204. The outputs from the bus interfaces/inputs 200 and 204 are fed into an OR gate 202. The output of the OR gate 202 is fed into an output node interface k-1 206. The output of the output node interface k-1 206 provides the Q signal. The burst counter 207 is coupled to the increment counter 219. The burst counter 207 generally comprises a delayed pre-drive signal Spp and the Q signal into an eighth AND gate 214 at inputs T1 and T2. The output of the AND gate 214 is either a '0' or '1', and this output is fed into a counter-2 216 at input T1. A further input of the counter-2 216 is an inverted k-1 signal. The k-1 signal is either a '0' or '1' and is from an output of a OR-1 gate 218. Inputs of the OR-1 gate 218 are the signals r1 and r2. The outputs of the counter-2 216 are the mux control signals b0, b1. A '1' and the b0 signal are respectively fed into a fifth AND gate 210 at inputs T1 and T2, and the output of the fifth AND gate 210 is a '0' or '1'. The 'b1' signal and a '1' are respectively fed into a sixth AND gate 212, and the output of the sixth AND gate 212 is a '0' or '1'. These outputs from AND gates 210 and 212 are respectively fed into inputs T1 and T2 of a seventh AND gate 208. The output of the seventh AND gate 208 generates a r3 signal.

The burst counter 207 is coupled to the increment counter 219. The increment counter 219 generally comprises the r3 signal being fed into a counter-3 222 at input T1. The counter-3 222 outputs the mux control signal b0, and this mux control signal b0 is inverted. A '1' and the inverted b0 signal are respectively fed into a ninth AND gate 220 at inputs T1 and T2. The output of the ninth AND gate 220 is a '0' or '1', and this output is the r2 signal. The r2 signal is fed into a B-2 delay buffer 224. The output from the B-2 delay buffer 224 is inverted and fed back into the counter-3 222.

Figure 14:
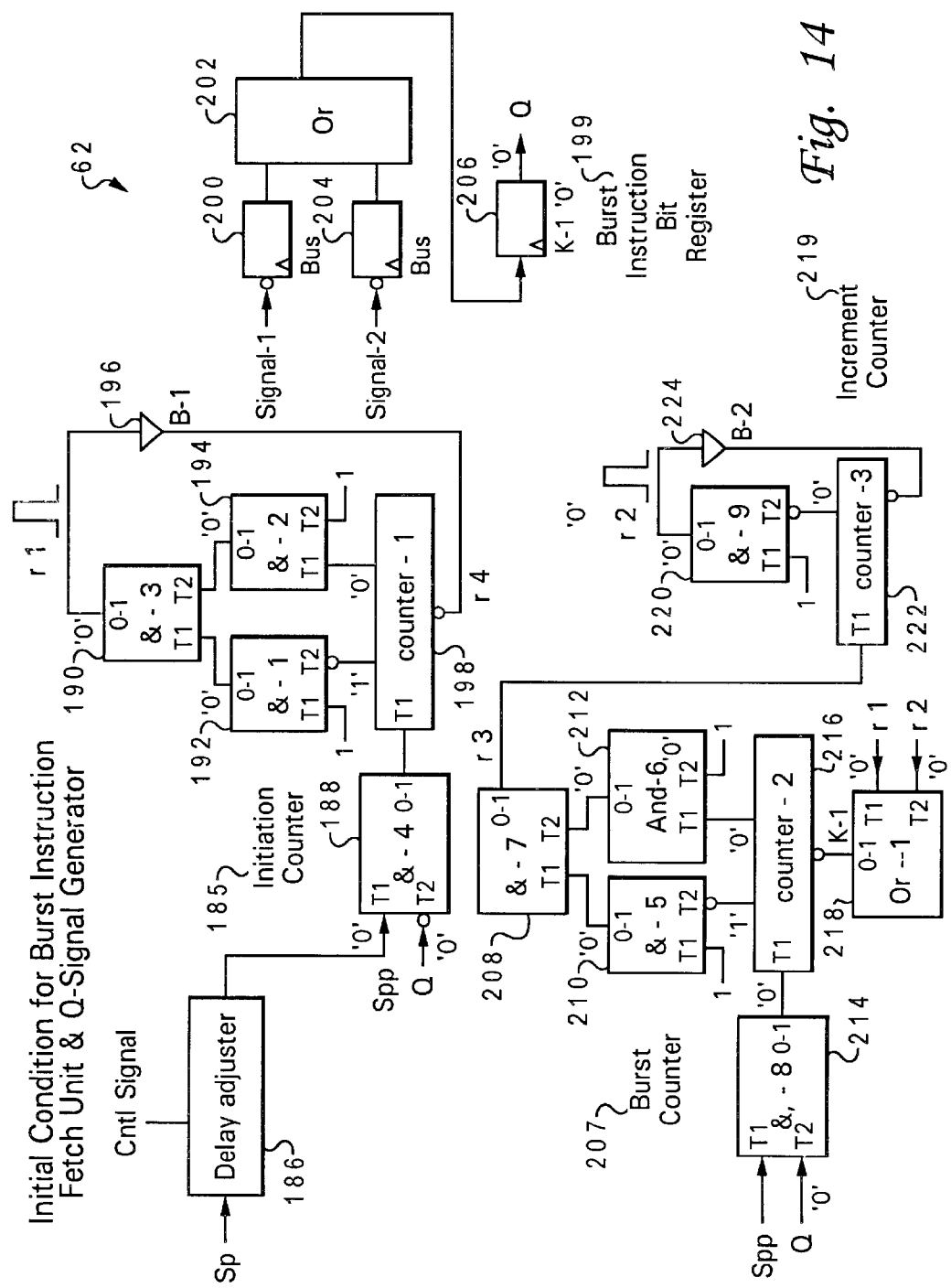
FIG. 14 is a block diagram of the initial condition for the Burst Instruction Fetch Unit and Q Signal generator.

With reference now to the figures and in particular with reference to FIG. 14, the signal condition of the unit 62 during idling (initial condition) is shown. In this operable unit 62, three resettable asynchronous ripple counters 185, 207, 219 (i.e. Initiation Counter, Burst Counter, and Increment Counter), a one 1-bit burst instruction register (BIR) 199, and a delay adjuster 186.

The delay adjuster 186 is used to delay the pre-drive signature signal Sp to generate a delayed pre-drive signature signal Spp so that the timing of the leading edge of the Q signal will coincide with the leading edge of the first bit of the incoming signal (or ¼ cycle behind the leading edge of the pre-drive signal). The delay adjuster 186 is calibrated with an on chip DLL. The burst instruction register (BIR) 199 is fed by the clock signals from the sending chip. The counters 185, 207, and 219 are respectively a 2 bit initiation counter, a 2 bit burst counter, and a 1 bit increment counter. The synchronizer 10 is designed to transfer data with the multiple of two transfers (16 bytes for an 8 byte bus) for one complete transfer process.

The signal transition of the initiation counter 185 of the first cycle is discussed. Counter-1 198 is the initiation counter that is a two bit asynchronous counter. The output bits b0, b1 having respective values of '1' and '0' of the counter-1 198 are fed to the first and second AND gates 192 and 194. A pair of set bits sb0, sb1 each having a '1' value are fed to the same two gates respectively. The outputs of the AND gates 192 and 194 are fed to the third AND gate 190. The r1 signal output of the third AND gate 190 is fed to the reset node of the counter 198 through delay buffer group 196 (i.e. delay buffer group B-1) and to the input of the OR gate 258 (i.e. OR-1 gate). The output of the delay buffer group 196 is the signal r4. The input of the counter 198 is controlled by the fourth AND gate 188. The inputs to the AND gate 188 are the delayed pre-drive signature signal Spp and the Q signal.

The Sb0, Sb1 set bits of the counter 198 are set to 1, 1 respectively. During idling, Sp=0, Q=0, the counter 198 is ready for the incoming signal. As Spp goes high, Ti (input) of the counter-1 198 goes high, and b0, b1 up counts from 1,0 to 0,1. The timing of all of these signal transitions are shown as the first cycle timing in FIG. 15. The Sp signal timing is shown in FIG. 7. The signal b0 is inverted to '1'. After delay of AND gate 192 and AND gate 190, the r1 signal goes high.

After the sum of delays of that of the 'OR' gate 218 and that of the burst instruction latch of the burst instruction bit register 199, the Q signal is updated from the signal fed from either of the clock signals from the sending chip. If one of these two clock signals is assertive, then Q is high or positive ('1'). The input to the counter-1 198 is closed. The counter-1 198 is also reset to 0,0. The timing of the reset signal insures that the AND gate 188 has to be closed before counter-1 198 is reset. The delay of the buffer B1 is longer than the total delay of delays for the burst instruction latch, the OR gate 218, and the AND gate 188.

Figure 15:
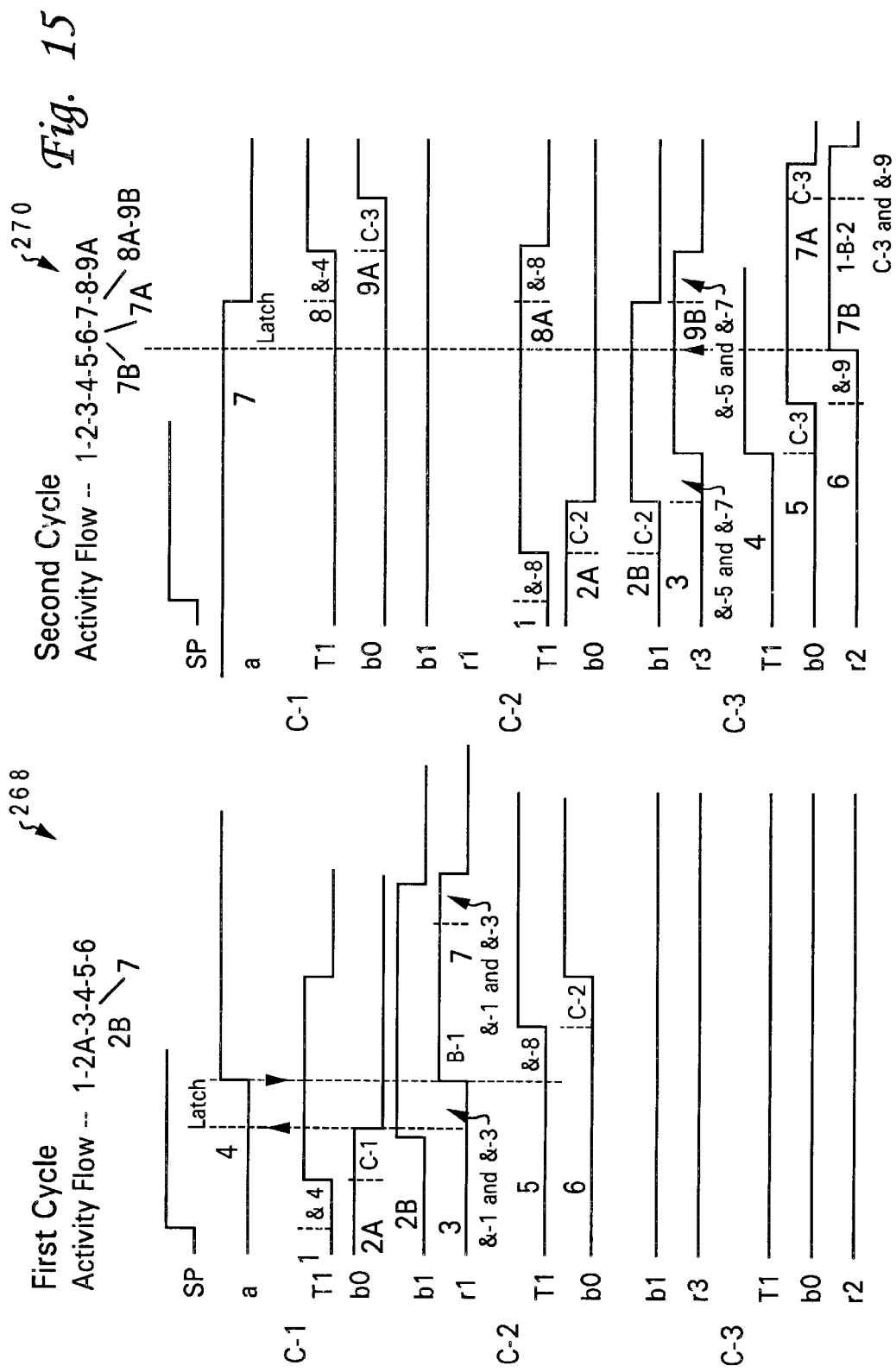
FIG. 15 are timing diagrams of first and second cycle operations of the present invention synchronizer.

The signal transition of the burst counter 207 and the increment counter 219 of the first cycle is further discussed. The timing diagram 268 of the first cycle is shown in FIG. 15. The counter-2 216 is similar to counter-1 198. The AND gates 210, 212, and 208 (AND gates 5, 6, and 7) replace the AND gates 192, 194, and 190 (AND gates 1, 2, and 3). The AND gate 214 (AND gate-8) replaces AND gate 188 (AND gate-4). However, the output of AND gate 208 (AND gate-7) is fed directly to the input of a 1 bit increment counter 222 (Counter-3) of the increment counter 219. Also, the reset node of the counter-2 216 is fed by the two way OR-1 gate 218 with signals r1 and r2 as inputs. As the Q signal is updated with the signal r1 as described in the earlier section, the AND gate 214 (i.e. AND gate-8) allows signal Spp to pass through. The input node 'T1' of counter-2 216 goes high. Although the bit b0 goes from '0' to '1' from the counter-2 216, the bit b1 from the counter-2 216 still remains at '0'. Since two set bits sb0 and sb1 of the counter-2 216 are set to 1,1, then the output of the AND gate 208 (i.e. AND gate-7) is still '0'. The increment counter 222 is set with Sb0=1 and is also initialized with b0=0.

The signal transition of the burst counter 207 and the increment counter 219 of the second cycle is now discussed. The timing diagram 270 of the second cycle is shown in FIG. 15. The positive transition of the Spp in the second cycle will up the count of the counter-2 216. The b0, b1 bits switch from 1,0 to 0,1. All inputs of the AND gates 210 and 212 (i.e. AND gates 5 and 6) go up or high. The output node of the AND gate 208 (i.e. AND gate 7) will eventually go up or high. In turn, the count of counter-3 222 is increased by one. The high voltage of r2 resets the counter-3 222. As the signal r2 switches to '1', the output node k-1 of the OR-1 gate 218 switches to '1' and reset counter 2 to b0=0, b1=1. The signal Q is then updated with either signal-1 or signal-2 from the sending chip. Depending on the value of the updated signal Q, counter-2 216 is commanded to either continue the counting or not.

The signal transitions of the burst counter 207 and the initiation counter 185 when the Q signal is updated from '1' to '0' is now discussed. As the Q signal transitions from '1' to '0', the completion of the signal transfer process is signified. The AND gate 214 closes the counter-2 216 input for Q=0. The counter-2 216 returns to its initial condition with b0=0, b1=0. The AND gate 188 is open, and the positive magnitude of the second cycle increases the count of the counter-1 198 from b0=0, b1=0 to b0=1, b1=0. The counter-1 198 also returns to its initiation condition and is ready for another signal process to begin.

The signal transition of the burst counter 207 when the Q signal is updated from '1' to '1' is now discussed.

The transition of the Q signal from '1' to '1' connotes that the data transfer process will continue. The AND gate 188 remains closed while the AND gate 214 remains open. The counter-2 216 is set to b0=1, b1=0. The process of counting for counter-2 216 will continue until the Q signal transition from '1' to '0' is reached.

The RQ signal generator is now discussed. The signal RQ is used to set and reset the counters for generation of both the pre-drive signature signal and the path identifier signal. The timing of the leading edge of the RQ signal coincides with that of the pre-drive signal. The trailing edge of the RQ signal coincides with the trailing edge of the Q signal. With reference now to the figures and in particular with reference to FIG. 17, a circuit 64 for generating the RQ signal (i.e. RQ signal generator) is shown. The S1 and S2 signals are inverted and are fed in as two inputs to an OR gate 286. The OR gate 286 is coupled to an AND gate 288, and the AND gate 288 is coupled to a 1 bit counter 290. The output of the OR gate 286 and the output of the 1 bit counter 290 are fed as inputs into the AND gate 288. The output of the AND gate 288 is fed into the input of the 1 bit counter 290. Also, the Q signal is fed to a delay buffer 294, inverted, and fed into the 1 bit counter 290 as well. The output of the 1 bit counter 290 and the Q signal are fed into an OR gate 292. The output of the OR gate 292 is the RQ signal. Besides the Q signal, the S1 and S2 signals are generally the other two input signals for the circuit 64. The 1 bit counter 290 is initialized to '0' as Q=0, S1&S2=0. As the positive transition of S1 or S2 occurs, the counter 290 increases the count to 1, and the RQ signal goes to '1'. When Q goes up, the RQ signal remains as '1', and the counter 290 is reset to 0. As Q=0, the RQ signal remains as 0, the counter 290 is released.

The path identifier signal generator is now discussed. The signals R1 and R2 are the path identifier signals. When R1 is equal to '1', then the signal being received is coming from an agent of a short path. Otherwise, the signal being received is coming from an agent of a long path. The signal R2 is the complementary signal with respect to the R1 signal. The valid window of the R1 signal is the same as that of the Q signal. If the data comes from an agent of a long path, then the signal valid window of R2 is defined by the leading edge of the pre-drive signal to the trailing edge of the last data received. Otherwise, it is the same as that of the Q signal.

The path identifier signal generator is now discussed. With reference now to the figures and in particular with reference to FIG. 16, a circuit 60 that is used to generate the path identifier signal (i.e. path identifier signal generator) is shown. This circuit 60 of FIG. 16 is similar to the drive identifier circuit 58 of FIG. 11. The circuit 60 includes two one bit asynchronous counters 276 and 282 each having a reset. A three (3) way AND gate 274 and a three (3) way AND gate 280 are respectively coupled to the counter 276 and the counter 282. An inverter is coupled in front of each of the three inputs of each gate 274 and 280. One of the inputs is fed by the Q signal into the AND gate 274, and another input is from an output timing mark signal of the timing mark signal generator 296 wherein this output signal is fed into the AND gate 280. The output of each counter 276 and 282 is fed back to the inputs of both AND gates 274 and 280 (i.e. a counter's own gate and the gate(s) of other counter(s)). The signal RQ is fed into the reset input of each counter 276 and 282.

The circuit 60 is shown to compare the timing of two signals. These two signals are the Q signal and the timing mark signal TM. The timing mark signal TM is derived from the free running clock K (as shown in FIGS. 7 and 16) through a timing mark signal generator circuit 296 shown in FIG. 18. The circuit 60 uses two one bit counters 276 and 282 to store one of the two signals Q or TM which first set the respective counter to '1'. The counter set and reset signal is RQ. Since the TM signal is a periodic signal, only one specific timing mark must be insured for use in comparing across the whole range of variation of the timing of the RQ signal.

The timing mark (TM) signal generator is now discussed. With reference now to the figures and in particular with reference to FIG. 18, the timing mark signal generator circuit 296 (i.e. timing mark signal generator) is shown. The timing mark signal generator 296 comprises a number of NAND gates 298, a delay buffer 310, and an inverted delay buffer 312 coupled in the manner shown in FIG. 18. The circuit 296 converts a wave form of a periodic square wave into a periodic wave form with a narrow width. The positive transition leading edge of such a narrow pulse coincides with the leading edge of the positive transition of the square wave. The pulse width is determined by the delay for a set of buffers and an inverter (B-5) inside the circuit 296. The wave forms of the input and output timing mark signals are shown in the timing diagram 314 of FIG. 18 along with the circuit 296. For the timing mark, a pulse width of 300–400 p-seconds is more than sufficient.

Figure 19:
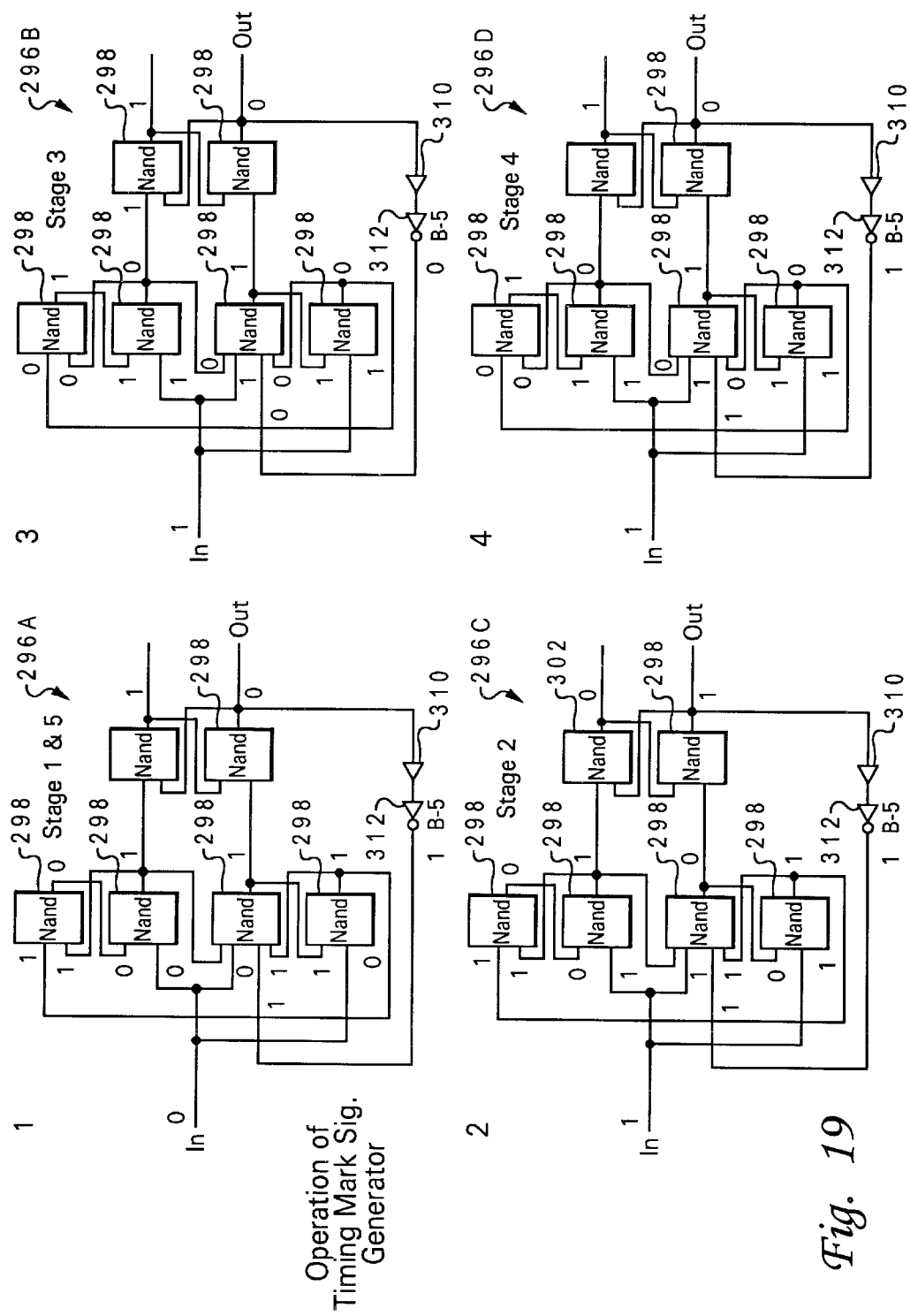
FIG. 19 is a block diagrams of four stages of operation of the timing mark signal generator of FIG. 18.

With reference now to the figures and in particular with reference to FIG. 19, four drawings 296A, 296B, 296C, and 296D are shown. The node voltages for various stages of operation for the timing mark circuit 296 are shown. Drawing 296A represents the idling and final stage of the operation of the circuit 296. The voltages of the output and input nodes of the timing mark circuit 296 are down or 0. For simplicity of illustration, it is assumed that the delays of all NAND gates 298 are small compared to that of the buffers and inverter B-5. As the input of the timing mark circuit 296 transitions from low to high, various node voltages of the circuit 296 are changed and shown in the drawing 296B. The node voltage of the output node of the inverter B-5 is still high or 1 even though its input node voltage of the first buffer has gone low or to 0 due to the delay associated with the inverter B-5 and the buffers. As the voltage of the output node of the inverter B-5 eventually goes low or to 0, the transition of all NAND gates 298 will follow. The voltages of all nodes after the transition are shown in drawing 296C. The output node of the timing mark circuit 296 is now low or 0. The '0' voltage of the output node of the timing mark circuit 296 in drawing 296C draws the voltage of the output node of the inverter B-5 to go high or to '1' after the delay.

As it goes high, the transition of the NAND gates 298 follows. The voltages of all nodes after the transition is shown in drawing 296D. The output node of the timing mark circuit 296 continues to be low. Finally, the voltage of the input node of the timing mark circuit 296 goes low, and the transition of the node voltage occurs except that of the output node of the timing mark circuit 296 and the output node of the inverter B-5. All respective node voltages are shown in drawing 296A.

The input node and the output node voltages of the timing mark circuit 296 has completed a cycle of transition in five stages of operations shown in the drawings 296A to 296D of FIG. 19. The output voltage of the timing mark circuit 296 only transitions once from low to high as the input node voltage goes from low to high. The duration of the output node remains high for a brief period of time. The period is approximately equal to the delay of the inverter B-5 and the buffers. The circuit 296 should be initialized either by scanning in the signal or cycling in the input of the circuit 296 several times.

While the invention has been particularly shown and described with reference to a preferred embodiment, it will be understood by those skilled in the art that various changes in form and detail may be made therein without departing from the spirit and scope of the invention.

What is claimed is:

1. A synchronizer system for providing a source-synchronized clock bus for transferring a signal from a sending chip in a capture clock domain to an internal clock domain, said synchronizer comprising:

at least one capture latch in the capture clock domain for capturing the signal, at least one storage latch for storing the signal, wherein the at least one storage latch is coupled to the at least one capture latch, and a multiplexer coupled between an output of the at least one storage latch and an input of an internal latch in the internal clock domain, wherein the multiplexer synchronizes data transfer of the at least one storage latch and the at least one capture latch, a control signal generator receiving strobe signals from the sending chip as inputs and generating first and second groups of control signals as outputs, wherein propagation of the signal from said at least one capture latch to said internal latch via said at least one storage latch is controlled in response to said strobe signals and said first group of control signals, and wherein said control signal generator derives said first group of control signals from said second group of control signals, and wherein said control signal generator derives said second group of control signals from the strobe signals, such that any significant delay variation is eliminated and signal separation is increased.

2. The synchronizer system according to claim 1, said control signal generator further comprising:

a first signal group generator that receives the second group of control signals and generates the first group of control signals, and a second signal group generator that receives the strobe signals and clock signals from the sending chip and that generates the second group of control signals.

3. The synchronizer system according to claim 2, wherein:

the first group of control signals further comprises at least one storage latch control signal for controlling the at least one storage latch, at least one multiplexer control signals for controlling the multiplexer, and a valid bit signal for identifying validity of data of the signal, and the second group of control signals further comprises a pre-drive signature signal, a counter reset signal, path identifier signals, drive identifier signals, another counter reset signal, and a timing mark signal.

4. The synchronizer system according to claim 3, said control signal generator further comprising:

a strobe receiver for receiving the strobe signals from the sending chip.

5. The synchronizer system according to claim 4, wherein:

the first signal group generator further comprises a storage latch control signal generator for generating the storage latch control signals and a multiplexer control signal generator for generating the multiplexer control signals, and a valid bit generator for generating the valid bit signal, and the second signal group generator further comprises a pre-drive signature signal generator for generating the pre-drive signature signal, a burst instruction fetch unit and counter reset signal generator for generating the counter reset signal, a reset signal generator for generating the another counter reset signal, a drive identifier signal generator for generating the drive identifier signals, a path identifier signal generator for generating the path identifier signals, and a timing mark signal generator for generating the timing mark signal.

6. The synchronizer system according to claim 5, wherein:

the strobe receiver receives and inputs the strobes from the signals and outputs the strobe signals to the pre-drive signature signal generator, the at least one capture latch, the storage latch control signal generator, the drive identifier signal generator, and the reset signal generator, the pre-drive signature signal generator receives the strobe signals and the another counter reset signal and outputs the pre-drive signature signal to the burst instruction fetch unit and counter reset signal generator, the burst instruction fetch unit and counter reset signal generator receives the pre-drive signature signal and the clock signals and outputs the counter reset signal to the reset signal generator, the drive identifier signal generator, the path identifier signal generator, and the valid bit generator, the reset signal generator receives the strobe signals and the counter reset signal and outputs the another counter reset signal to the pre-drive signature signal generator and the path identifier signal generator, the path identifier signal generator receives the counter reset signal and the another counter reset signal and outputs the path identifier signals to the multiplexer control signal generator, the drive identifier signal generator receives the strobe signals and the counter reset signal and outputs the drive identifier signals to the storage latch control signal generator and the multiplexer control signal generator, the storage latch control signal generator receives the strobe signals and the drive identifier signals and outputs the storage latch control signals to the at least one storage latch, and the multiplexer control signal generator receives the drive identifier signals and the path identifier signals and outputs the multiplexer control signals to the multiplexer.

7. A synchronizer system for providing a source-synchronized clock bus for transferring a signal from a sending chip in a capture clock domain to an internal clock domain, said synchronizer comprising:

at least one capture latch in the capture clock domain for capturing the signal, at least one storage latch for storing the signal, wherein the at least one storage latch is coupled to the at least one capture latch, a multiplexer coupled between an output of the at least one storage latch and an input of an internal latch in the internal clock domain, wherein the multiplexer synchronizes data transfer of the at least one storage latch and the at least one capture latch, and a control signal generator receiving strobe signals from the sending chip as inputs and generating first and second groups of control signals as outputs, wherein propagation of the signal from said at least one capture latch to said internal latch via said at least one storage latch is controlled in response to said strobe signals and said first group of control signals, and wherein said control signal generator derives said first group of control signals from said second group of control signals, and wherein the at least one capture latch and at least one storage latch comprises two pairs of latches, wherein each of the two pairs comprises a storage latch and a capture latch, and wherein the two pairs of latches are coupled to the multiplexer.

8. A method of synchronizing transfer of a signal from a sending chip to a receiving chip having a synchronizer, said method comprising:

capturing the signal with at least one capture latch in said synchronizer, said capture latch being in a capture clock domain, transferring the signal from the at least one capture latch via at least one storage latch in the synchronizer to an internal latch in an internal clock domain of the receiving chip, synchronizing transfer of the signal from the at least one capture latch to the internal latch utilizing a multiplexer, controlling operation of said at least one capture latch, said at least one storage latch an said multiplexer utilizing control signals, said control signals including strobe signals, and receiving said strobe signals from said sending chip and generating a remainder of said control signals based upon said strobe signals, such that any significant delay variation is eliminated and signal separation is increased.

9. The method according to claim 8, wherein the signal includes a short path signal portion and a long path signal portion having different signal path lengths.

10. The method according to claim 9, wherein:

the capturing step further comprises the step of capturing the signal in the at least one capture latch in a cycle, the controlling step further comprises:

determining whether the long path signal portion from the cycle occurs before or after the short path signal portion from a next cycle has been captured, in response to a determination that that long path signal portion from the cycle occurs after the short path signal portion from the next cycle, first storing the short path signal portion from the cycle from the at least one capture latch into the at least one storage latch and secondly capturing the short path signal portion from the next cycle in the at least one capture latch and thirdly capturing the long path signal portion from the cycle in the at least one capture latch, in response to a determination that the long path signal portion from the cycle occurs before the short path signal portion from the next cycle, first storing the short path signal portion from the cycle from the at least one capture latch into the at least one storage latch and secondly capturing the long path signal portion from the cycle in the at least one capture latch and thirdly capturing the short path signal portion from the next cycle in the at least one capture latch, the transferring step further comprises the step of transferring the short path signal portion from the cycle from the at least one storage latch to the internal latch and transferring the long path signal portion from the cycle from the at least one capture latch to the internal latch at a transfer time for a cycle, and repeating the above steps until signal transfer is complete.

* * * * *